United States Patent
Yi et al.

(10) Patent No.: US 9,171,889 B2
(45) Date of Patent: Oct. 27, 2015

(54) ELECTRONIC DEVICES HAVING SEMICONDUCTOR MEMORIES

(71) Applicant: SK hynix Inc., Icheon-Si (KR)

(72) Inventors: Jae-Yun Yi, Icheon-Si (KR); Seok-Pyo Song, Icheon-Si (KR); Joon-Seop Sim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 29 days.

(21) Appl. No.: 14/274,588

(22) Filed: May 9, 2014

(65) Prior Publication Data

US 2015/0092472 A1    Apr. 2, 2015

(30) Foreign Application Priority Data

Sep. 30, 2013    (KR) .................. 10-2013-0116116

(51) Int. Cl.
```
H01L 27/24     (2006.01)
H01L 49/02     (2006.01)
H01L 45/00     (2006.01)
H01L 43/02     (2006.01)
```
(52) U.S. Cl.
CPC ............ *H01L 27/2463* (2013.01); *H01L 28/91* (2013.01); *H01L 43/02* (2013.01); *H01L 45/1253* (2013.01)

(58) Field of Classification Search
None
See application file for complete search history.

(56) References Cited

U.S. PATENT DOCUMENTS

| | | | |
|---|---|---|---|
| 2007/0252185 A1* | 11/2007 | Kang | 257/295 |
| 2009/0040802 A1* | 2/2009 | Arakawa | 365/51 |
| 2014/0124881 A1* | 5/2014 | Kwon et al. | 257/421 |

FOREIGN PATENT DOCUMENTS

| | | |
|---|---|---|
| KR | 1020060134579 A | 12/2006 |
| KR | 1020100095242 A | 8/2010 |

* cited by examiner

*Primary Examiner* — Mamadou Diallo
(74) *Attorney, Agent, or Firm* — Perkins Coie LLP

(57) ABSTRACT

Provided is an electronic device including a semiconductor memory which includes a cell array region having a first variable resistance element and a peripheral circuit region having a decoupling capacitor, the decoupling capacitor including a bottom electrode, a dielectric layer pattern, and a top electrode. The cell array region may include: a first gate; a first contact over the first gate; a second contact over an active region at one side of the first gate; and the first variable resistance element over the second contact, and the peripheral circuit region may include: a second gate formed of the same material at the same level as the first gate; the bottom electrode disposed over the second gate and formed at the same level as the first contact; and the dielectric layer pattern and the top electrode disposed over the bottom electrode.

20 Claims, 26 Drawing Sheets

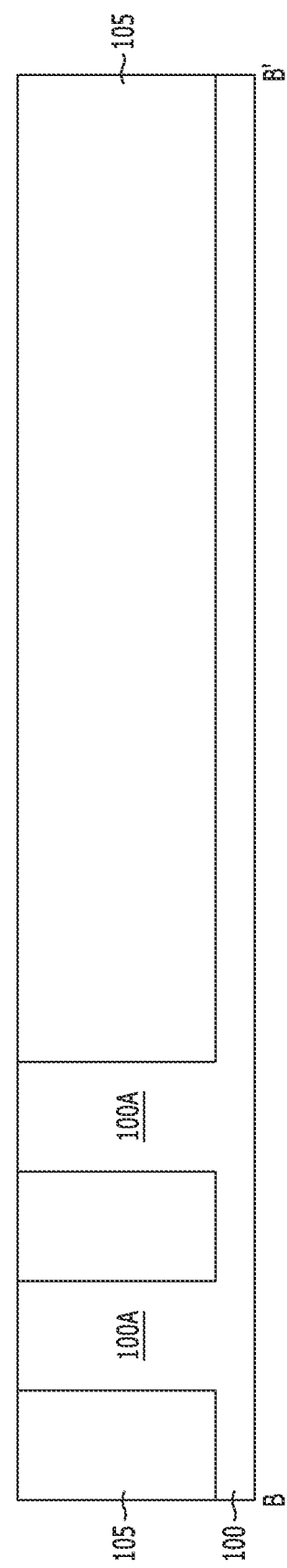

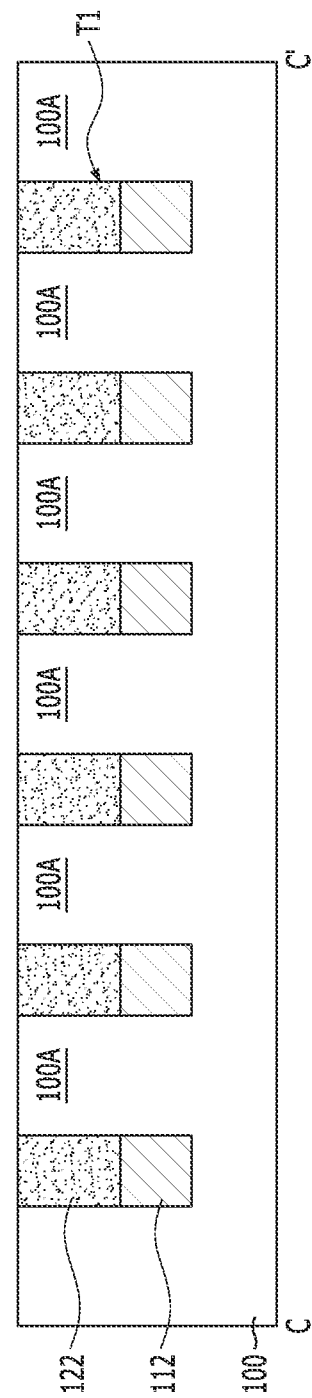

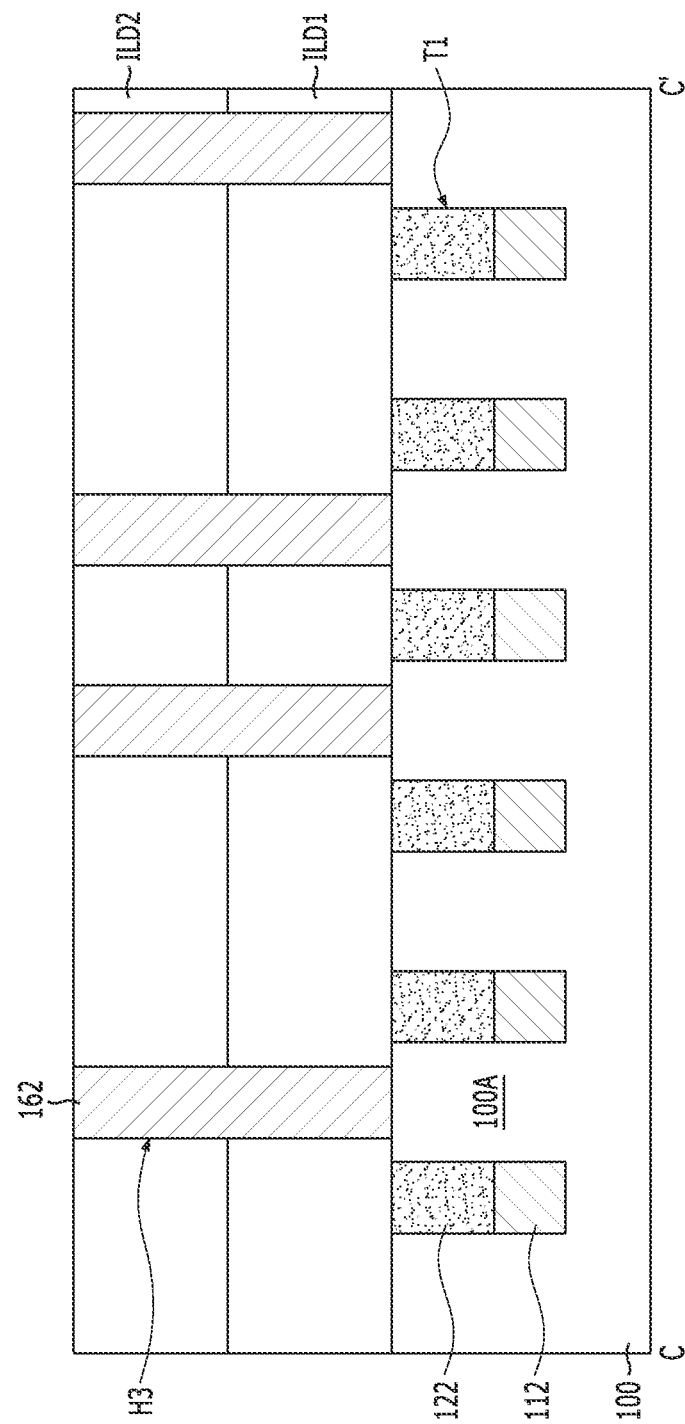

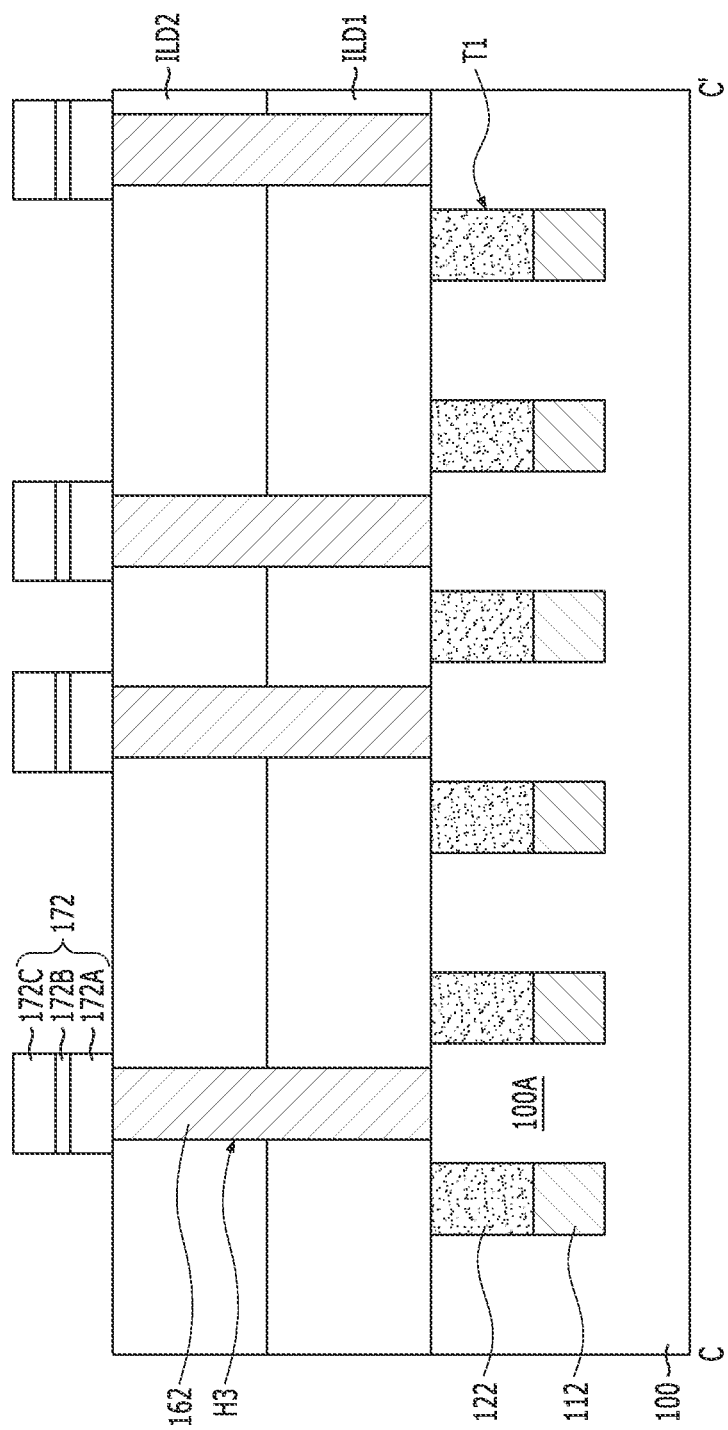

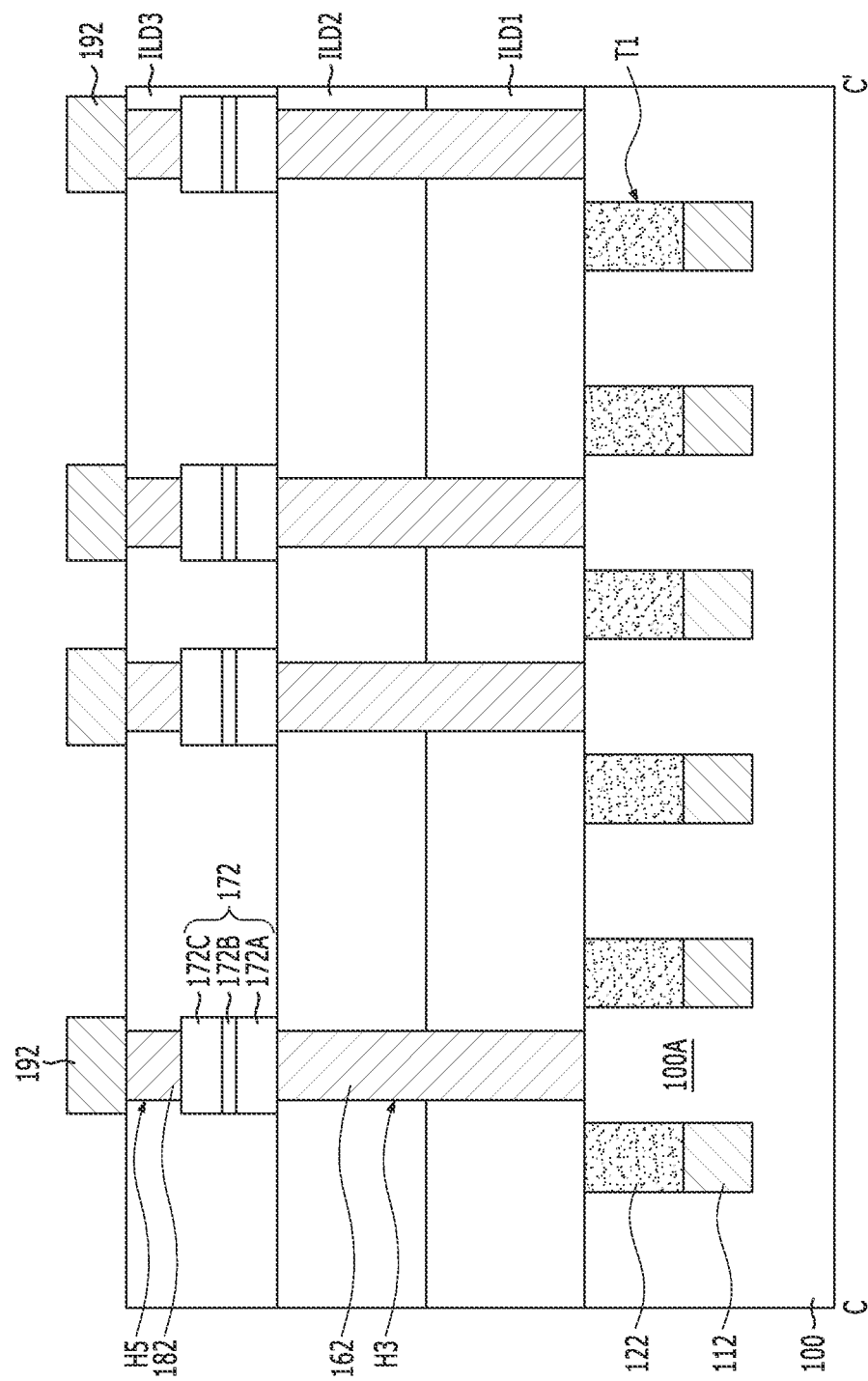

ELECTRONIC DEVICES HAVING SEMICONDUCTOR MEMORIES

CROSS-REFERENCE TO RELATED APPLICATIONS

The present application claims priority of Korean Patent Application No. 10-2013-0116116, entitled "ELECTRONIC DEVICE" and filed on Sep. 30, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such electronic devices have been conducted. Examples of such semiconductor devices include semiconductor devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which is capable of implementing a high-capacity decoupling capacitor without increasing the size of a device including a variable resistance element and improving the characteristics of the variable resistance element and the decoupling capacitor.

In one aspect, an electronic device including a semiconductor memory is provided to include: a cell array region having a first variable resistance element and a peripheral circuit region having a decoupling capacitor including a bottom electrode, a dielectric layer pattern, and a top electrode, wherein the cell array region includes: a first gate, a first contact over the first gate, a second contact over an active region at one side of the first gate, and the first variable resistance element over the second contact, and the peripheral circuit region includes a second gate formed of the same material at the same level as the first gate, the bottom electrode disposed over the second gate and formed at the same level as the first contact, and the dielectric layer pattern and the top electrode disposed over the bottom electrode and positioned at a lower level than the first variable resistance element.

In another aspect, an electronic device including a semiconductor memory is provided to include: a cell array region having a first variable resistance element and a peripheral circuit region having a decoupling capacitor including a bottom electrode, a dielectric layer pattern, and a top electrode, wherein the cell array region includes: a first gate, a first contact over the first gate, a second contact over an active region at one side of the first gate, and the first variable resistance element over the second contact, and the peripheral circuit region includes a second gate formed of the same material at the same level as the first gate, the bottom electrode disposed over the second gate and formed at the same level as the first contact, and the dielectric layer pattern and the top electrode disposed over the bottom electrode and positioned at a lower level than the first variable resistance element, wherein the decoupling capacitor is coupled in the semiconductor memory to filter noise in a voltage applied to operate the first variable resistance element.

In some implementations, the first variable resistance element includes a first ferromagnetic layer, a second ferromagnetic layer, and a tunnel barrier layer interposed therebetween, and the peripheral circuit region further includes a second variable resistance element disposed over the top electrode and formed of the same material at the same level as the first variable resistance element. In some implementations, the bottom electrode comprises a plurality of bottom electrodes, the top electrode has a plate shape to overlap all or a part of the plurality of bottom electrodes, and the second variable resistance element has the same or a similar plate shape as or to the top electrode. In some implementations, the bottom electrode comprises a plurality of bottom electrodes commonly coupled to the second gate, and the top electrode comprises a first top electrode to overlap a part of the plurality of bottom electrodes and a second top electrode to overlap the other part of the plurality of bottom electrodes.

In some implementations, a first operating voltage applied to the first top electrode and a second operating voltage applied to the second top electrode are different from each other. In some implementations, the bottom electrode comprises a plurality of bottom electrodes commonly coupled to the second gate, and the top electrode overlaps the plurality of bottom electrodes. In some implementations, a first operating voltage applied to the first top electrode and a second operating voltage applied to the second gate are different from each other. In some implementations, the bottom electrode has a cylinder shape. In some implementations, the first and second gates are buried in the semiconductor substrate. In some implementations, the first variable resistance element includes a metal oxide, a phase change material, a ferroelectric material, or a ferromagnetic material. In some implementations, the cell array region further comprises a first wiring coupled to the first contact and a bit line coupled to the first variable resistance element, the peripheral circuit region further comprises a second wiring coupled to the top electrode, and the first wiring, the bit line, and the second wiring are formed of the same material at the same level. In some implementations, the peripheral circuit region further comprises a third wiring coupled to the second gate through a contact, and the first wiring, the bit line, the second wiring, and the third wiring are formed of the same material at the same level. In some implementations, the decoupling capacitor filters noise in a voltage applied to operate the first variable resistance element and is electrically coupled to the first variable resistance element in the semiconductor memory.

In some implementations, the top electrode has a plate shape and the second variable resistance element has a shape that is the same as or similar to a shape of the top electrode. In some implementations, the top electrode includes a first top electrode and a second top electrode that are separate from each other. In some implementations, the first top electrode and the second top electrode are provided with different levels of operating voltages. In some implementations, the top electrode substantially covers the peripheral cell region. In some implementations, the first top electrode and the second gate are at different levels of operating voltages. In some implementations, the peripheral circuit region further includes a second variable resistance element disposed over the top electrode. In some implementations, the bottom electrode includes a plurality of bottom electrodes, the top electrode has a plate shape to overlap one or more of the plurality of bottom electrodes, and the second variable resistance element has a shape that is the same as or similar to a shape of the top electrode. In some implementations, the bottom electrode includes a plurality of bottom electrodes coupled to the second gate, and the top electrode includes a first top electrode and a second top electrode that are separate from each other and overlap part of the plurality of bottom electrodes and the rest of the plurality of bottom electrodes, respectively.

In another aspect, an electronic device is provided to include a semiconductor memory which includes a cell array region comprising a first variable resistance element having a first ferromagnetic layer, a second ferromagnetic layer, and a tunnel barrier layer interposed therebetween; and a peripheral circuit region comprising a decoupling capacitor having a bottom electrode, a dielectric layer pattern, and a top electrode and a second variable resistance element disposed over the top electrode and formed of the same material at the same level as the first variable resistance element.

In some implementations, the bottom electrode comprises a plurality of bottom electrodes, the top electrode has a plate shape to overlap a part or all of the plurality of bottom electrodes, and the second variable resistance element has the same or a similar plate shape as or to the top electrode. In some implementations, the top electrode comprises a first top electrode to overlap a part of the plurality of bottom electrodes and a second top electrode to overlap the other part of the plurality of bottom electrodes, and a first operating voltage applied to the first top electrode and a second operating voltage applied to the second top electrode are different from each other. In some implementations, the top electrode overlaps all of the plurality of bottom electrodes, and a first operating voltage applied to the top electrode and a second operating voltage applied to the bottom electrode are different from each other.

In some implementations, the variable resistance element is structured as the first variable resistance element and is positioned at the same level as the first variable resistance element. In some implementations, the bottom electrode includes a plurality of bottom electrodes, and the top electrode has a plate shape to overlap one or more of the plurality of bottom electrodes, and the second variable resistance element has a shape that is the same as or similar to a shape of the top electrode. In some implementations, the top electrode includes a first top electrode and a second top electrode that are separate from each other and overlap part of the plurality of bottom electrodes and the rest of the plurality of bottom electrodes, respectively, and the first top electrode and the second top electrode are provided with different levels of operating voltages. In some implementations, the top electrode overlaps all of the plurality of bottom electrodes, and the top electrode and the bottom electrode are provided with different levels of operating voltages.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method of manufacturing an electronic device including semiconductor memory is provided to include: processing a substrate to include a cell array region and a peripheral region, wherein the cell array region including active regions defined by an isolation layer; forming first buried gates in the cell array region and second buried gates in the peripheral region, wherein some of the first buried gates and active regions at both sides thereof form transistors; forming a bottom electrode, a dielectric pattern, and a top electrode in the peripheral region to form a decoupling capacitor; and forming variable resistance elements in the cell array region as semiconductor memory cells wherein one ends of the variable resistance elements are connected to the transistors and the other ends of the variable resistance elements are connected to bit lines, wherein the decoupling capacitor is formed to be positioned at a lower level than the variable resistance element before the forming of the variable resistance element.

In some implementations, the method further includes, after the decoupling capacitor is formed, performing a heat treatment on the decoupling capacitor to increase the capacity of the decoupling capacitor. In some implementations, the transistors formed by two adjacent first buried gates are connected in series such that the transistors having source terminals connected to a common source line and having drain terminals connected to the respective variable resistance elements. In some implementations, the top electrode is divided into two portions to form two decoupling capacitors connected in series.

In another aspect, a method of manufacturing an electronic device including semiconductor memory is provided to include: providing a cell array region as part of the semiconductor memory to include (1) variable resistance elements for storing data and (2) transistors coupled in series and sharing a source region, each transistor formed with a first buried gate and source and drain regions at both sides of the first buried gate; providing, as part of the semiconductor memory, a peripheral region adjacent to the cell array region to include decoupling capacitors coupled in series and formed with bottom electrodes coupled to the same second buried gate, dielectric layer patterns, and top electrodes; and coupling the decoupling capacitors in the semiconductor memory to filter noise in a voltage in the semiconductor memory.

These and other aspects, implementations and associated advantages are described in greater detail in the drawings, the description and the claims.

BRIEF DESCRIPTION OF THE DRAWINGS

FIG. 2A to 7C are cross-sectional views for explaining the semiconductor device of FIG. 1 and a method for fabricating the same.

DETAILED DESCRIPTION

Figure 1:
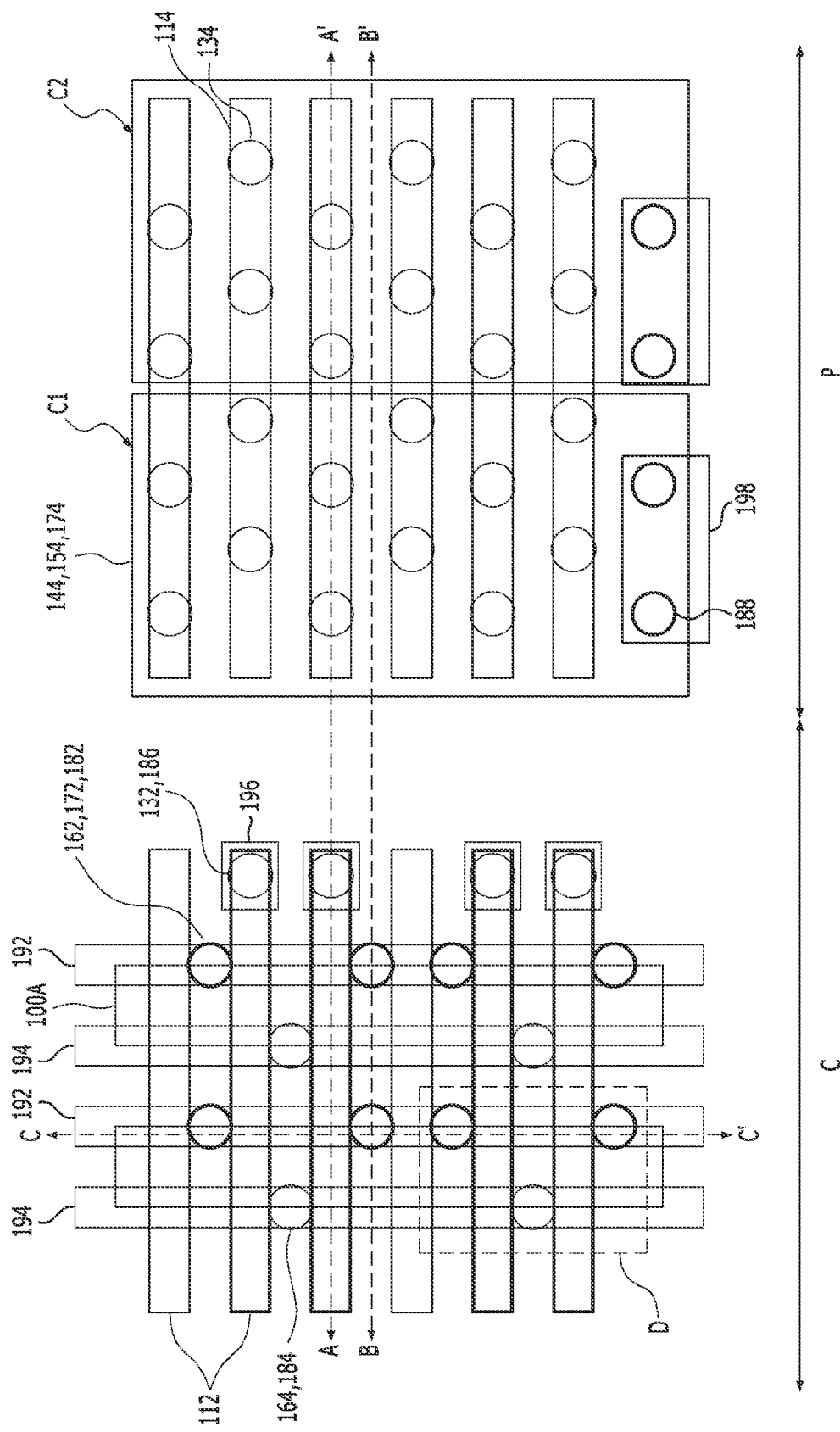
FIG. 1 is a plan view of a semiconductor device in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A semiconductor device in accordance with an implementation may include a decoupling capacitor formed in a peripheral circuit region. The decoupling capacitor is an element for filtering noise which exists between circuit components or locations at various operating voltages such as power supply voltage VDD and ground voltage VSS. For example, the decoupling capacitor filters noise in a voltage applied to operate a variable resistance element and is electrically coupled to the variable resistance element. In order for the decoupling capacitor to have a high capacity, a stable operating voltage may be supplied. The disclosed technology in this document includes designs and techniques for how to implement a high-capacity decoupling capacitor in a peripheral circuit region, when a variable resistance element is provided in a cell array region.

FIGS. 1 to 8B illustrate examples of electronic and semiconductor devices having decoupling capacitors and variable resistance elements and associated fabrication methods.

FIG. 1 is a plan view of a semiconductor device in accordance with an implementation. FIG. 2A to 7C are cross-sectional views for explaining the semiconductor device of FIG. 1 and a method for fabricating the same. FIG. 8A is a circuit equivalent as a portion D of FIG. 1, and FIG. 8B is a circuit equivalent as a peripheral circuit region of FIG. 1. FIGS. 2A to 7A are cross-sectional views taken along line A-A' of FIG. 1. FIGS. 2B to 7B are cross-sectional views taken along line B-B' of FIG. 1. FIGS. 2C to 7C are cross-sectional views taken along line C-C' of FIG. 1.

First, the fabrication method will be described.

Referring to FIGS. 1, 2A, 2B, and 2C, a semiconductor substrate 100 is provided. The semiconductor substrate 100 may include a cell array region C in which a plurality of memory cells are formed and a peripheral circuit region P in which a decoupling capacitor is formed.

An isolation layer 105 may be formed in the semiconductor substrate 100 to define one or more active regions 100A in the cell array region C. The active region 100A may have a line shape extended in a first direction parallel to line C-C'. The isolation layer 105 may be formed through the following process: regions of the semiconductor substrate 100 excluding the active regions 100A are etched to a predetermined depth so as to form isolation trenches and an insulating layer such as oxide is buried in the isolation trenches.

First and second buried gates 112 and 114 are formed in the semiconductor substrate 100 so as to extend in a second direction crossing the first direction. The first buried gate 112 may be formed in the cell array region C so as to cross the active region 100A, and the second buried gate 114 may be formed in the peripheral circuit region P. The first and second buried gates 112 and 114 may be formed through the following process: the active region 100A and the isolation layer 105 disposed in the regions in which the first and second buried gates 112 and 114 are to be formed are selectively etched to form first and second trenches T1 and T2, a gate dielectric layer (not illustrated) is formed on the inner walls of the first and second trenches T1 and T2, and a conductive material such as metal or metal nitride is buried in parts of the first and second trenches T1 and T2. The other parts of the first and second trenches T1 and T2 in which the first and second buried gates 112 and 114 are formed may be filled with an insulating layer such as nitride. Next, first and second capping layers 122 and 124 may be formed over the first and second buried gates 112 and 114, respectively.

Among the first buried gates 112 of the cell array region C, the first buried gate 112 indicated by a relatively thicker line may serve as a gate of a transistor (see FIG. 1). The first buried gate 112 indicated by a thick line and the active regions 100A at both sides thereof may form one transistor. Thus, a pair of first buried gates 112 including two adjacent first buried gates 112 indicated by a thick line, an active region 100A therebetween, and active regions 100A at both sides of the pair of first buried gates 112 may form two transistors coupled to each other in series. Hereafter, for convenience of description of the illustrated example, an active region 100A between a pair of first buried gates 112 is referred to as a source region, and active regions 100A at both sides of the pair of first buried gates 112 excluding the source region are referred to as drain regions. A first buried gate 112 indicated by a relatively thinner line is not used as a gate of a transistor and is used to isolate or separate two transistors from other two transistors in the first direction.

Figure 2A:
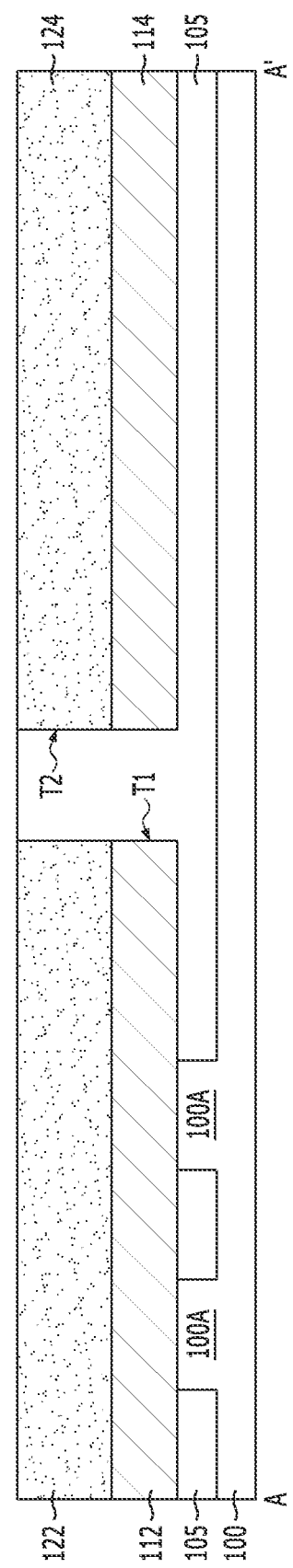

Referring to FIGS. 1 and 3A to 3C, a first interlayer dielectric layer ILD1 is formed to cover the resultant structure of FIGS. 2A to 2C. The first interlayer dielectric layer ILD1 may include oxide.

The first interlayer dielectric layer ILD1 and the first capping layer 122 of the cell array region C are selectively etched to form a first hole H1 which exposes the first buried gate 112 serving as a gate of a transistor (refer to a thicker line). The first interlayer dielectric layer ILD1 and the second capping layer 124 of the peripheral region P are selectively etched to form a second hole H2 which exposes the second buried gate 114. The first hole H1 for forming a contact to couple the first buried gate 112 to an external wiring may be formed at a position to overlap with an end of the first buried gate 112. The location of the first hole H1 is designed to spatially deviate it from a region in which a variable resistance element is located. The second hole H2 serves to provide a space in which a bottom electrode of a decoupling capacitor is to be formed, and may include any structures as long as the second hole H2 overlaps with the second buried gate 114. In the present implementation, four second holes H2 are formed in each second buried gate 114 along the second direction. Thus in this particular example, the plurality of second holes H2 are arranged to collectively form a zigzag shape that extends in the first direction, thereby securing a distance therebetween. However, other implementations are also possible on the configuration of the second holes H2. The number of second holes H2 and the positions of the second holes H2 overlapping the second buried gate 114 may be changed in various manners.

A mask (not illustrated) is formed to cover the peripheral circuit region P such that the second hole H2 is not exposed. In this circumstance, a first contact 132 is formed to be buried in the first hole H1. The first contact 132 may be formed through the following process: a conductive material is deposited to a thickness to sufficiently fill the first hole H1 and a planarization process, for example, a chemical mechanical polishing (CMP) process is performed to expose the first interlayer dielectric layer ILD1.

A bottom electrode 134 of a decoupling capacitor having a cylinder shape may be formed in the second hole H2. In order to form the bottom electrode 134, a relatively thin layer of a conductive material is deposited along the profile of the structure including the second hole H2 and a planarization process is subsequently performed to expose the first interlayer dielectric layer ILD1. In a design where the bottom electrode 134 has a cylinder shape, the surface area of the bottom electrode 134 may be increased to improve the capacity of the decoupling capacitor. Although the bottom electrode 134 has a cylinder shape in the present implementation, other implementations are also possible. For example, the bottom electrode 134 of the decoupling capacitor may have the same pillar shape as the first contact 132. The bottom electrode 134 may be formed of metal such as Ru or metal nitride such as TiN or TiAlN.

Although in the present implementation, the first contact 132 is formed first and is followed by formation of the bottom electrode 134, other implementations are also possible. For example, the bottom electrode 134 may be formed first before forming the first contact 132. Furthermore, the first contact 132 and the bottom electrode 134 may be formed at the same time. In this case, the first contact 132 and the bottom electrode 134 may have substantially the same shape, for example, a cylinder shape or pillar shape.

Figure 3A:
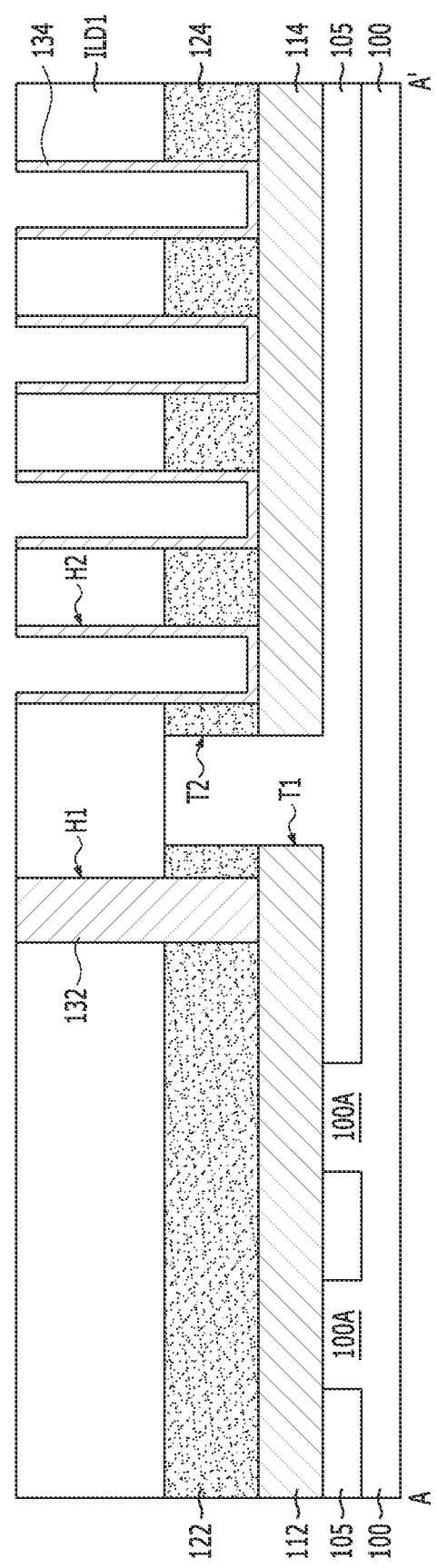
Figure 3B:
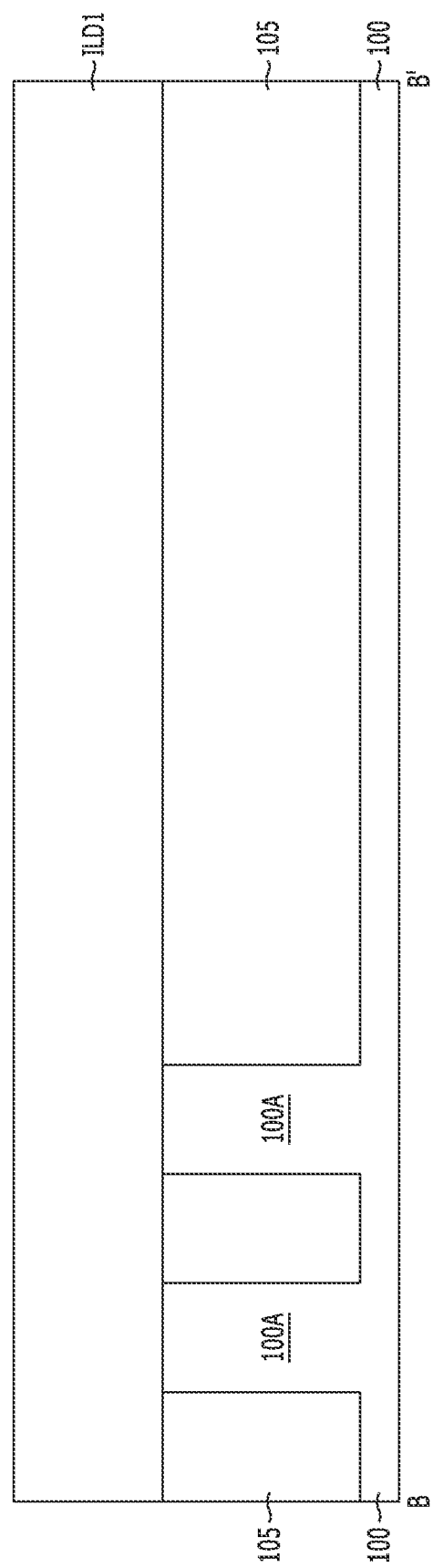
Figure 3C:
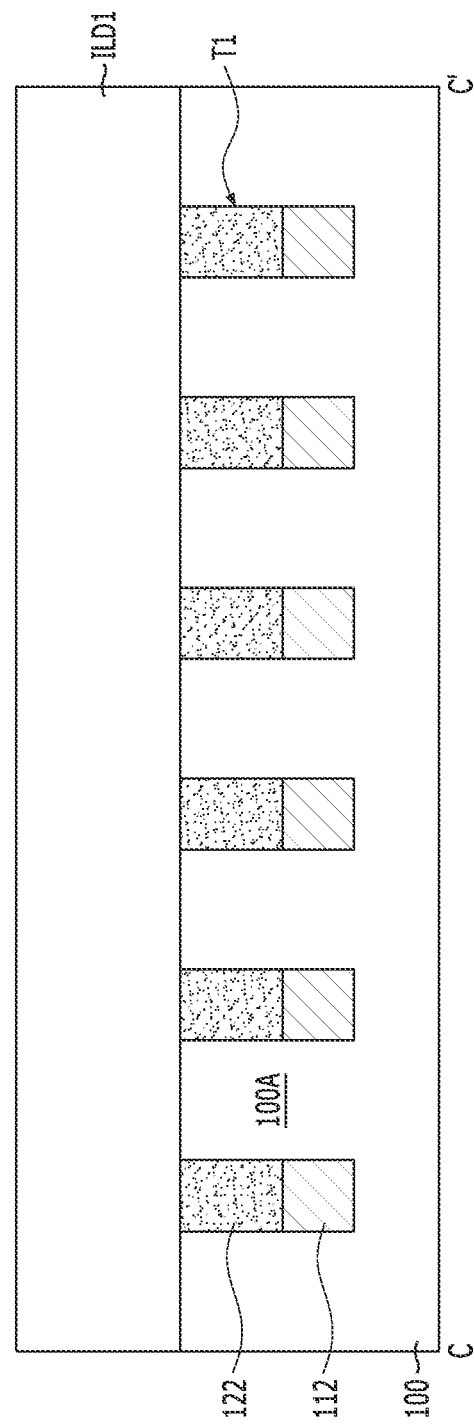
Figure 4A:
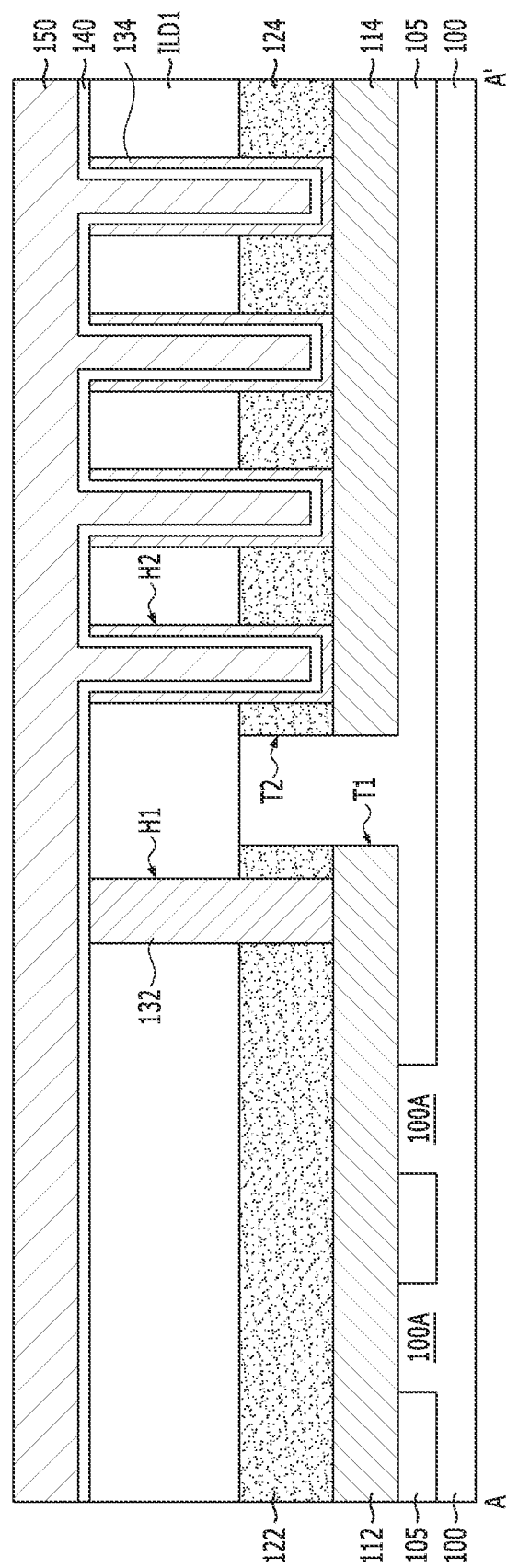
Figure 4B:
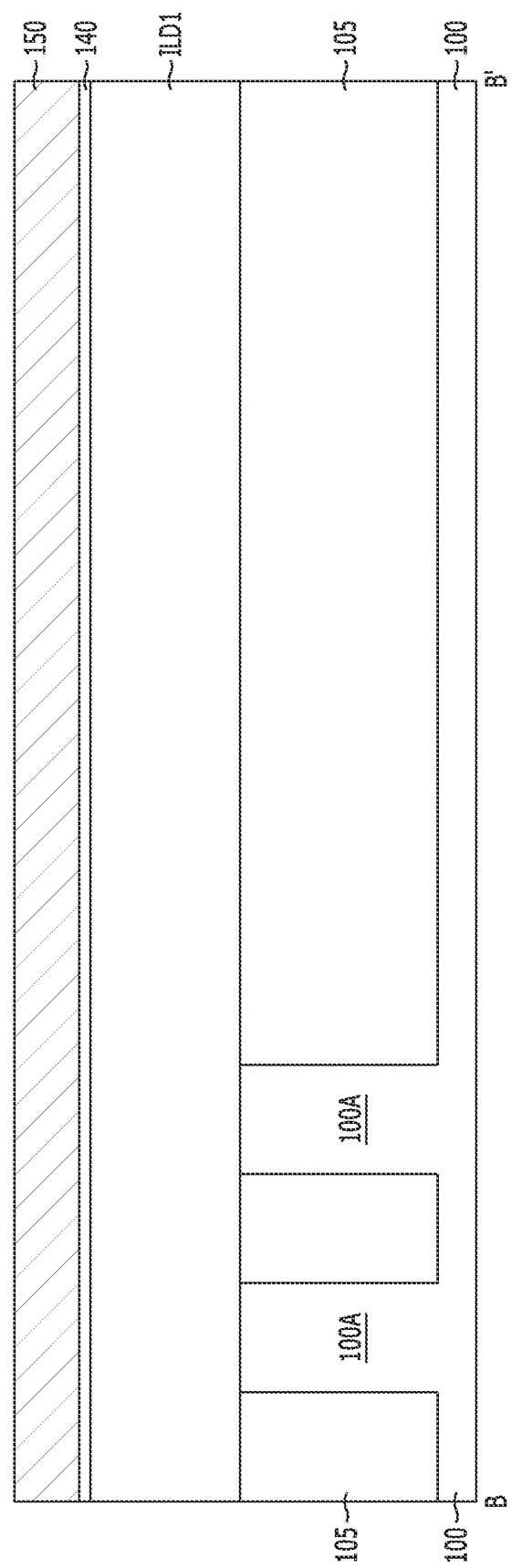
Figure 4C:
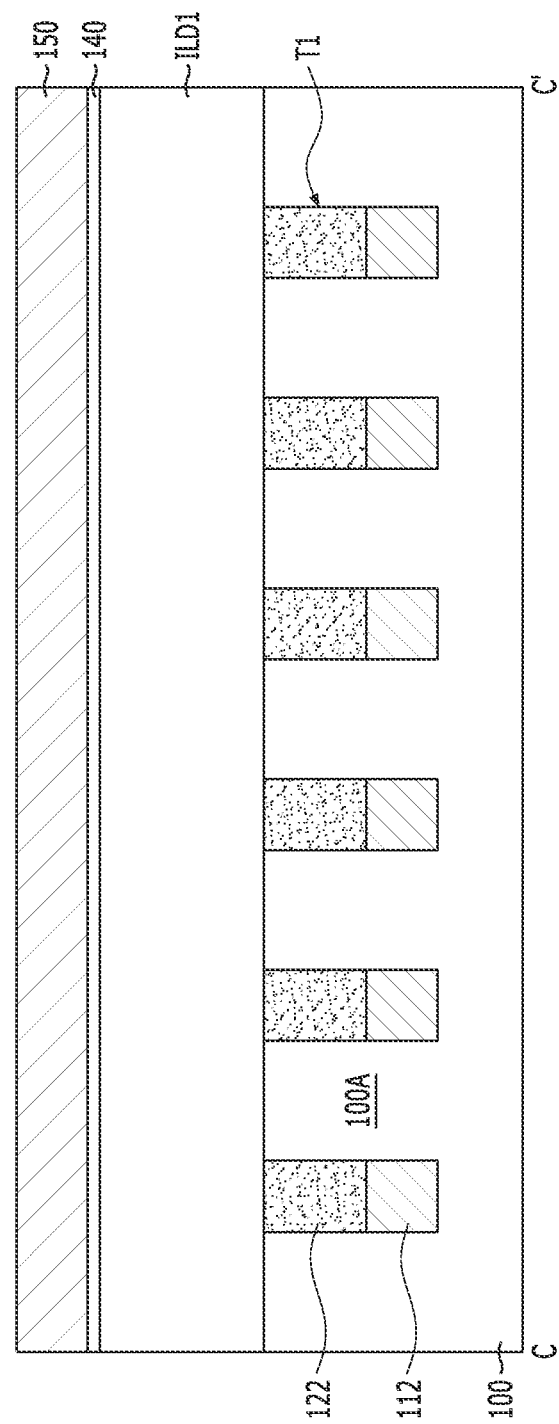

Referring to FIGS. 1 and 4A to 4C, a dielectric layer 140 is formed along the profile of the resultant structure of FIGS. 3A to 3C. The dielectric layer 140 may have a thickness that does not fill the second hole H2 in which the bottom electrode 134 is formed, and may include an oxide-based layer such as ZrO, HfO, AlO, SiO, BaSrTiO, or SrTiO.

A conductive layer 150 is formed over the dielectric layer 140 to have a thickness to sufficiently fill the second hole H2 having the dielectric layer 140 formed therein. The conductive layer 150 may include metal such as Ru or metal nitride such as TiN or TiAlN as similar as the bottom electrode 134.

Referring to FIGS. 1 and FIGS. 5A to 5C, the dielectric layer 140 and the conductive layer 150 positioned over the first interlayer dielectric layer ILD1 are selectively etched to form a dielectric layer pattern 144 and a top electrode 154 which overlap the bottom electrode 134 in the peripheral circuit region P. The dielectric layer pattern 144 and the top electrode 154 may be removed from the cell array region C. In the present implementation, the dielectric layer pattern 144 and the top electrode 154 may have a plate shape to cover the peripheral circuit region P, and may be separated into two parts in the second direction. The dielectric layer pattern 144 and the top electrode 154 in the left side may have a plate shape to overlap second holes H2 corresponding to the left half in the second direction, and the dielectric layer pattern 144 and the top electrode 154 in the right side may have a plate shape to overlap second holes H2 corresponding to the right half in the second direction.

As the dielectric layer pattern 144 and the top electrode 154 are formed, a decoupling capacitor including the bottom electrode 134, the dielectric layer pattern 144, and the top electrode 154 may be formed in the peripheral circuit region P. In the present implementation, first and second decoupling capacitors C1 and C2 connected in series may be formed. Specifically, the bottom electrode 134 of the first decoupling capacitor C1 and the bottom electrode 134 of the second decoupling capacitor C2 may be commonly coupled to a corresponding second buried gate 114. Thus, one ends of the first and second decoupling capacitors C1 and C2 may be coupled in series to each other. On the other hand, since the top electrodes 154 of the first and second decoupling capacitors C1 and C2 are separated from each other, the other ends of the first and second decoupling capacitors C1 and C2 may be separately controlled.

After the first and second decoupling capacitors C1 and C2 are formed, a heat treatment may be performed. The heat treatment is performed to crystallize the bottom electrode 134 and at least one of the dielectric layer pattern 144 and the top electrode 154 or remove impurities contained in the dielectric layer pattern 144, thereby increasing the capacity of the first and second decoupling capacitors C1 and C2. The heat treatment may be performed at a high temperature of 500° C. or more.

A second interlayer dielectric layer ILD2 is formed to cover the resultant structure in which the dielectric layer pattern 144 and the top electrode 154 are formed.

Then, third and fourth holes H3 and H4 are formed to be coupled to the active region 100A through the first and second interlayer dielectric layers ILD1 and ILD2 of the cell array region C, and second and third contacts 162 and 164 are formed to fill the third and fourth holes H3 and H4. The second and third contacts 162 and 164 may be formed by depositing a conductive material to a thickness to sufficiently fill the third and fourth holes H3 and H4 and performing a planarization process until the second interlayer dielectric layer ILD2 is exposed.

The second contact 162 may be coupled to the drain regions, that is, the active regions 100A at both sides of the pair of first buried gates 112, and the third contact 164 may be coupled to the source region, that is, between the pair of first buried gates 112. The second contact 162 provides a portion to be coupled to a variable resistance element and a bit line, and the third contact 164 provides a portion to be coupled to a source line. At this time, the second contact 162 may be formed at one side of the active region 100A in the second direction, for example, at the right side of the active region 100A, and the third contact 164 may be formed at the other side of the active region 100A, for example, at the left side of the active region 100A. In this manner, a distance between a bit line to be formed over the second contact 162 and a source line to be formed over the third contact 164 can be guaranteed.

Figure 5A:
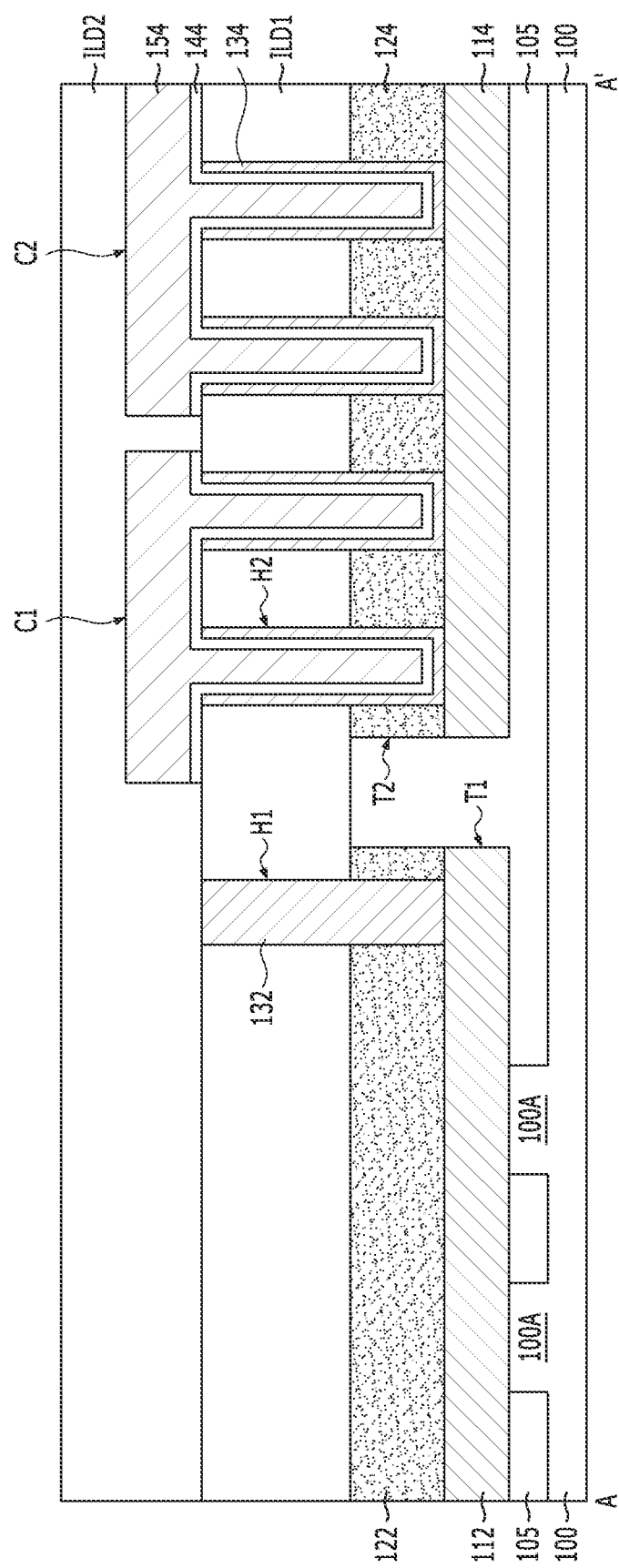
Figure 5B:
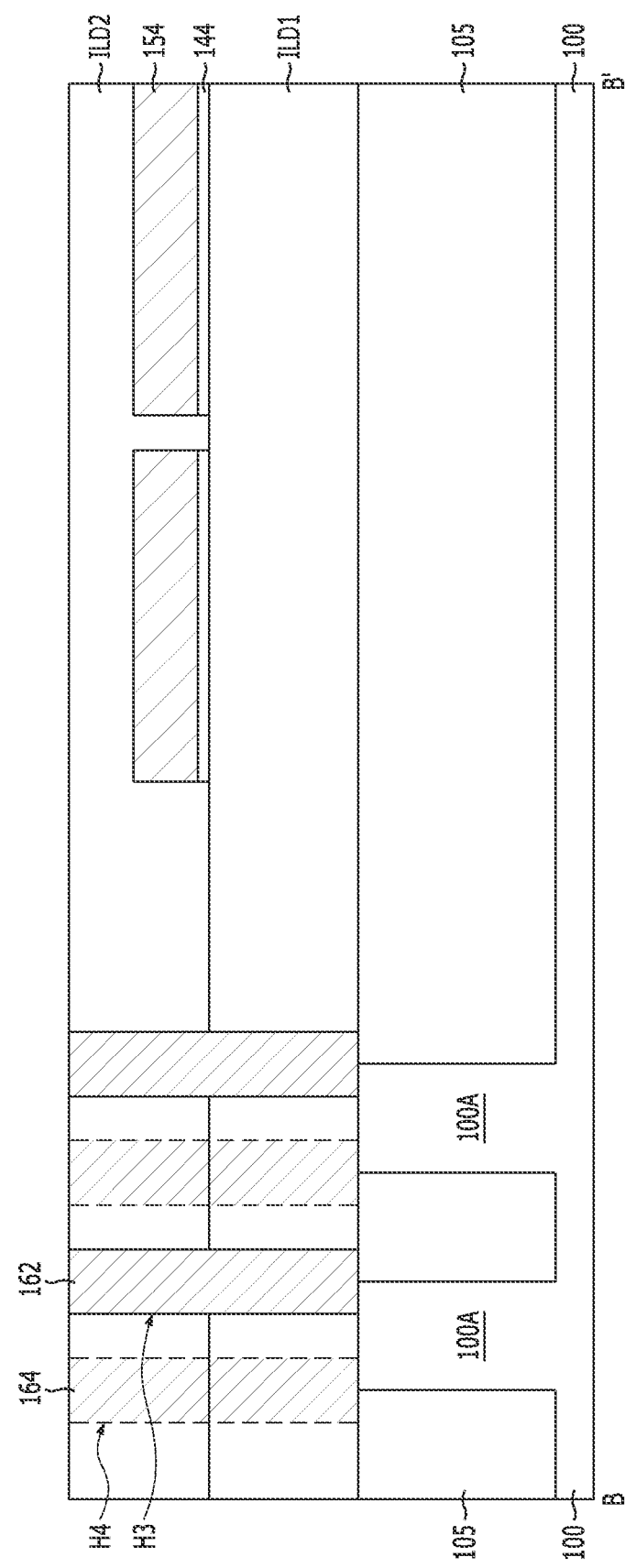

Although the third contact 164 is not seen in the cross-sectional views of FIGS. 5A to 5C, for convenience of description, however, the third contact 164 is indicated by a dotted line in FIG. 5B.

Referring to FIGS. 1 and 6A to 6C, a planarization process, for example, a CMP process may be performed to expose the top electrode 154.

Next, a variable resistance material may be deposited over the planarized structure and then patterned to form a first variable resistance element 172 and a second variable resistance element 174. The first variable resistance element 172 is coupled to the second contact 162 of the cell array region C, and the second variable resistance element 174 is coupled to the top electrode 154 of the peripheral circuit region P.

Figure 7A:
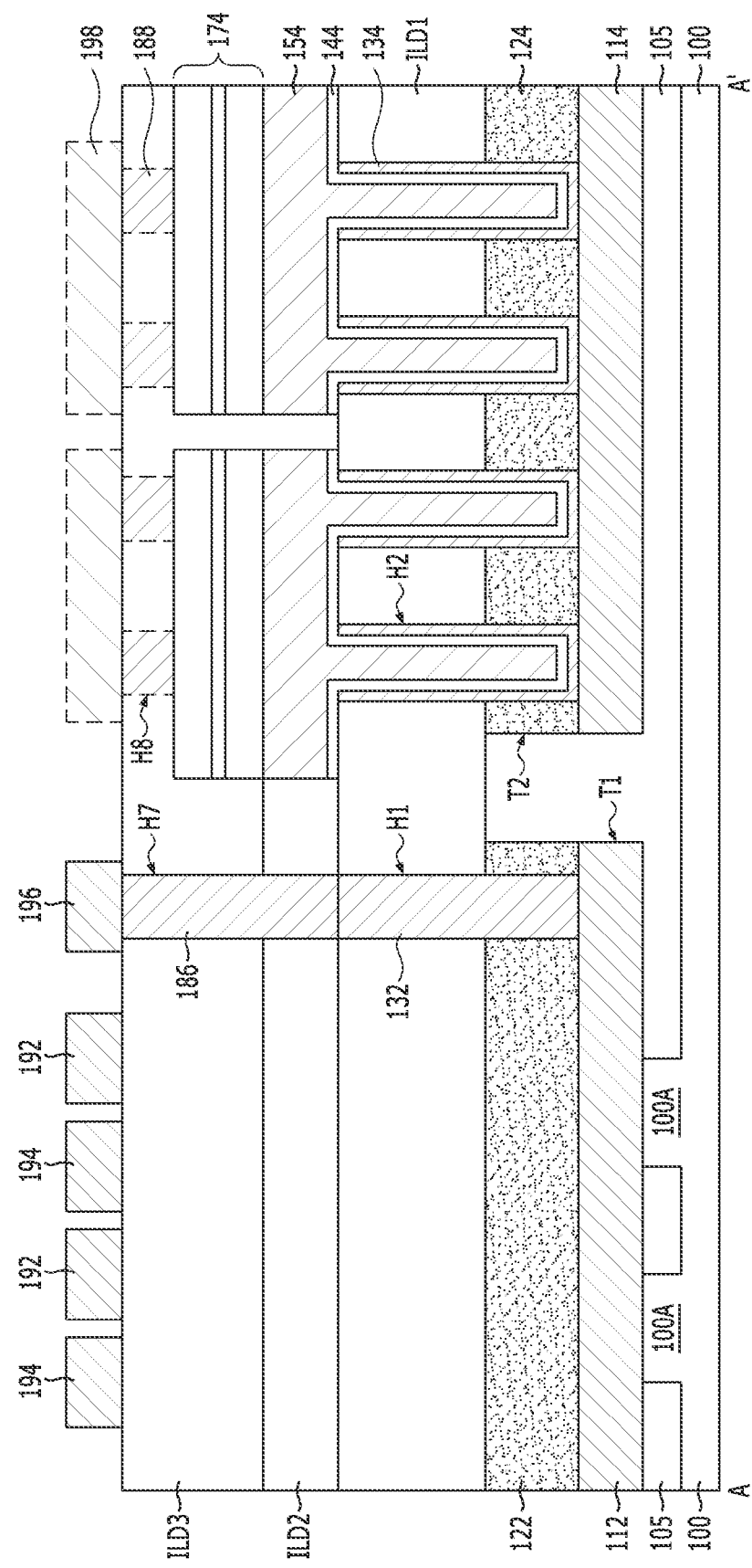
Figure 7B:
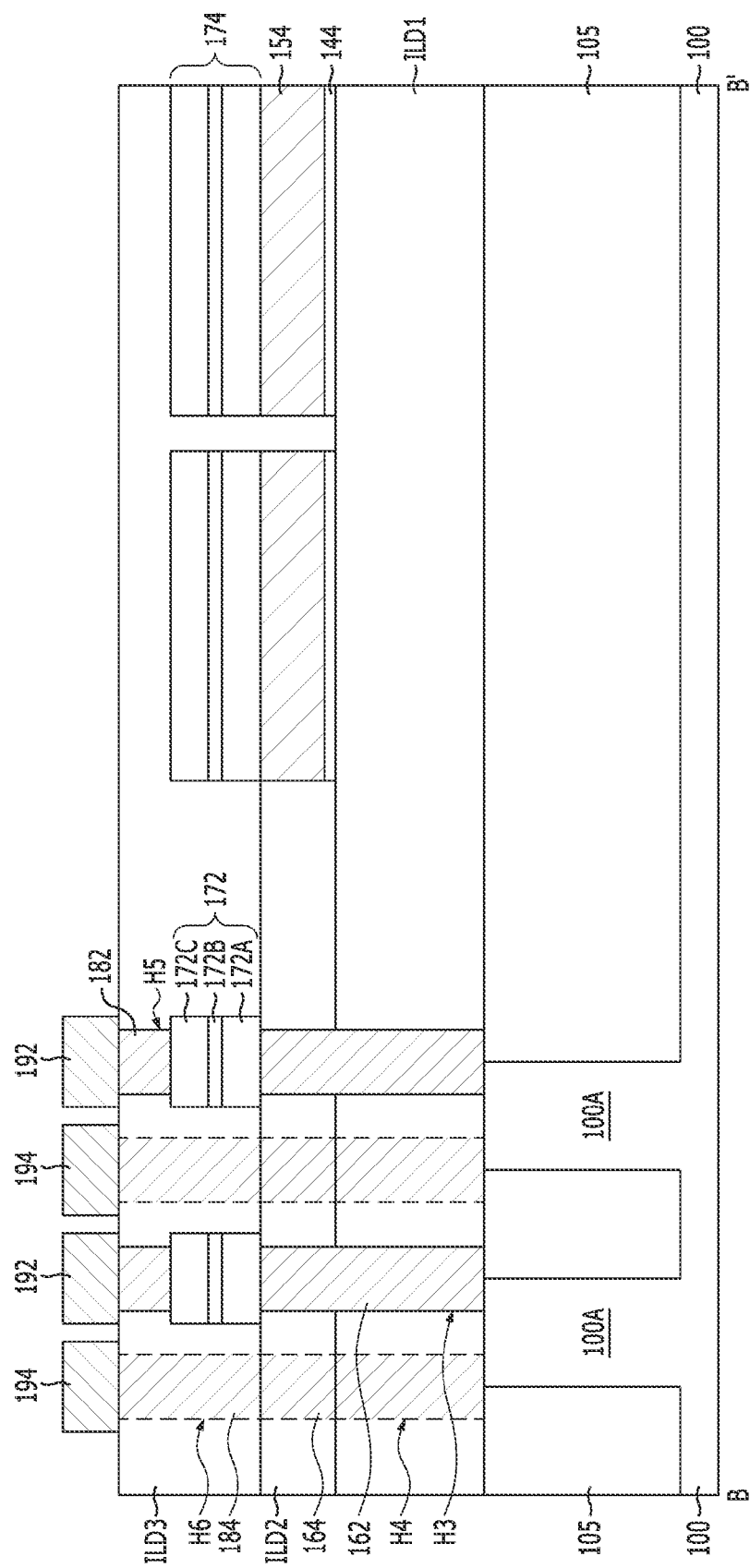
Figure 8A:
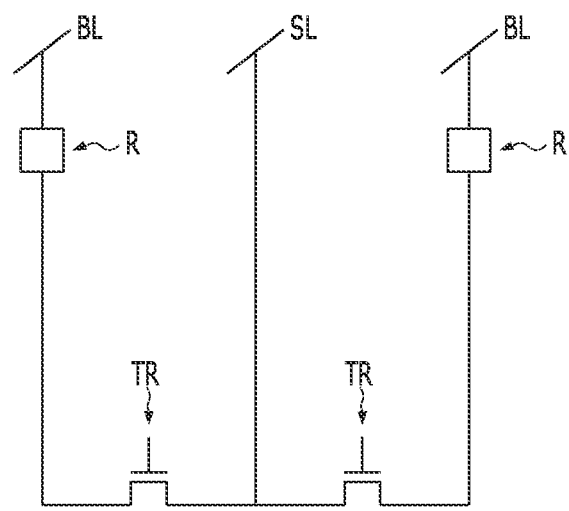
FIG. 8A is an equivalent circuit diagram corresponding to a portion D of FIG. 1.
Figure 8B:
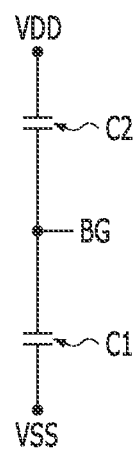
FIG. 8B is an equivalent circuit diagram corresponding to a peripheral circuit region of FIG. 1.

The first variable resistance element 172 may switch between different resistance states according to a voltage or current applied through the second contact 162 coupled to the bottom thereof and a contact coupled to the top thereof (refer to 182 of FIGS. 7B and 7C). In the present implementation, the first variable resistance element 172 may be a magnetic tunnel junction (MTJ) including a first ferromagnetic layer 172A, a tunnel barrier layer 172B, and a second ferromagnetic layer 172C. In this case, any one of the first and second ferromagnetic layers 172A and 172C may serve as a pinned layer of which the magnetization direction is pinned, and the other one may serve as a free layer of which the magnetization direction is changed. For example, the first and second ferromagnetic layers 172A and 172C may be formed of a monolayer or multilayer including Fe—Pt alloy, Fe—Pd alloy, Co—Pd alloy, Co—Pt alloy, Fe—Ni—Pt alloy, Co—Fe—Pt alloy, Co—Ni—Pt alloy and the like. The tunnel barrier layer 172B may change the magnetization direction of the free layer by the tunneling of electrons, and may be formed of a monolayer or multilayer including oxides such as MgO, CaO, SrO, TiO, VO, and NbO. However, other implementations are also possible. For example, in another implementation, the first variable resistance element 172 may be formed of a monolayer or multilayer including various materials used for RRAM, PRAM, FRAM and the like, for example, a metal oxide such as transition metal oxide or perovskite-based material, a phase change material such as chalcogenide-based material, a ferroelectric material and the like.

The second variable resistance element 174 may be formed together with the first variable resistance element 172. Thus, the second variable resistance element can be formed of the same material at the same level, but the second variable resistance element 174 may not function as a variable resistance element. The second variable resistance element 174 may have the substantially same as or similar to the plane shape of the top electrode 154, and thus have a large plan area. In the case of MTJ, the resistance thereof significantly decreases with the increase of area. When the second variable resistance element 174 is an MTJ, the second variable resistance element 174 may significantly reduce the resistance of the top electrodes 154 of the decoupling capacitors C1 and C2, thereby further improving the noise removal characteristic of the decoupling capacitors C1 and C2. In other implementations, the second variable resistance element 174 may be omitted.

Figure 6A:
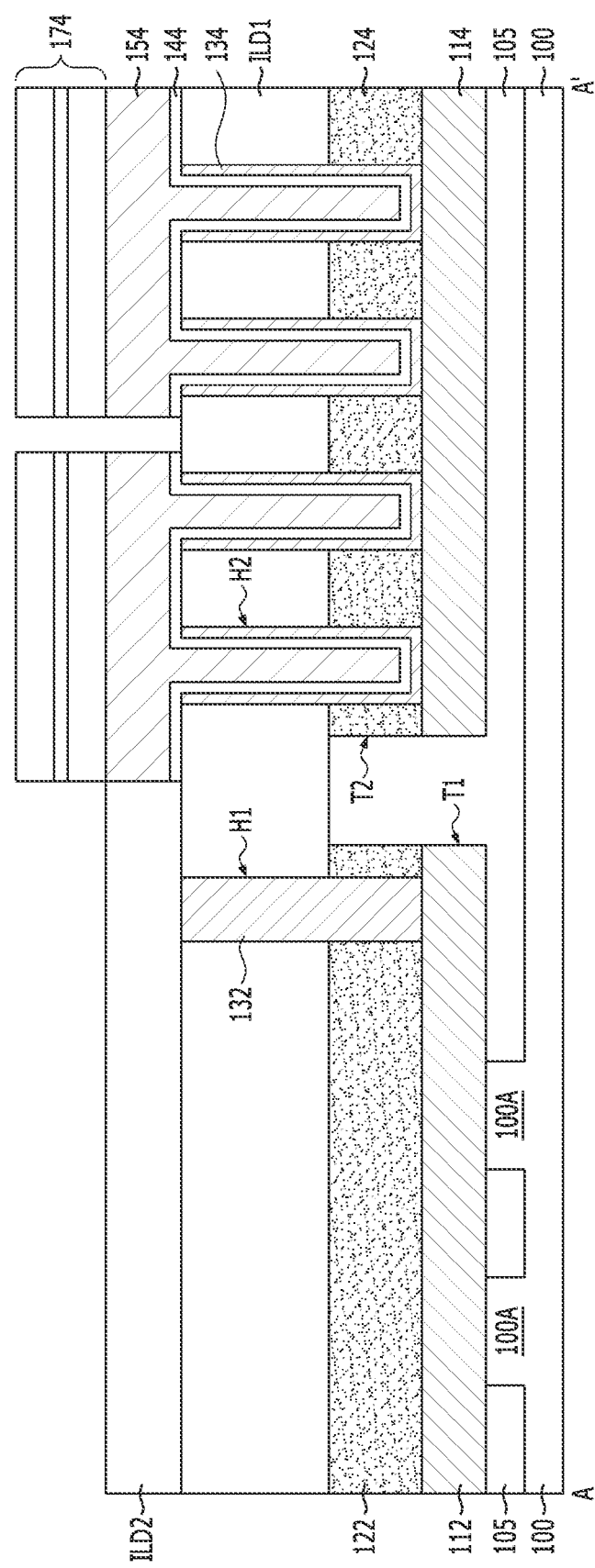
Figure 6B:
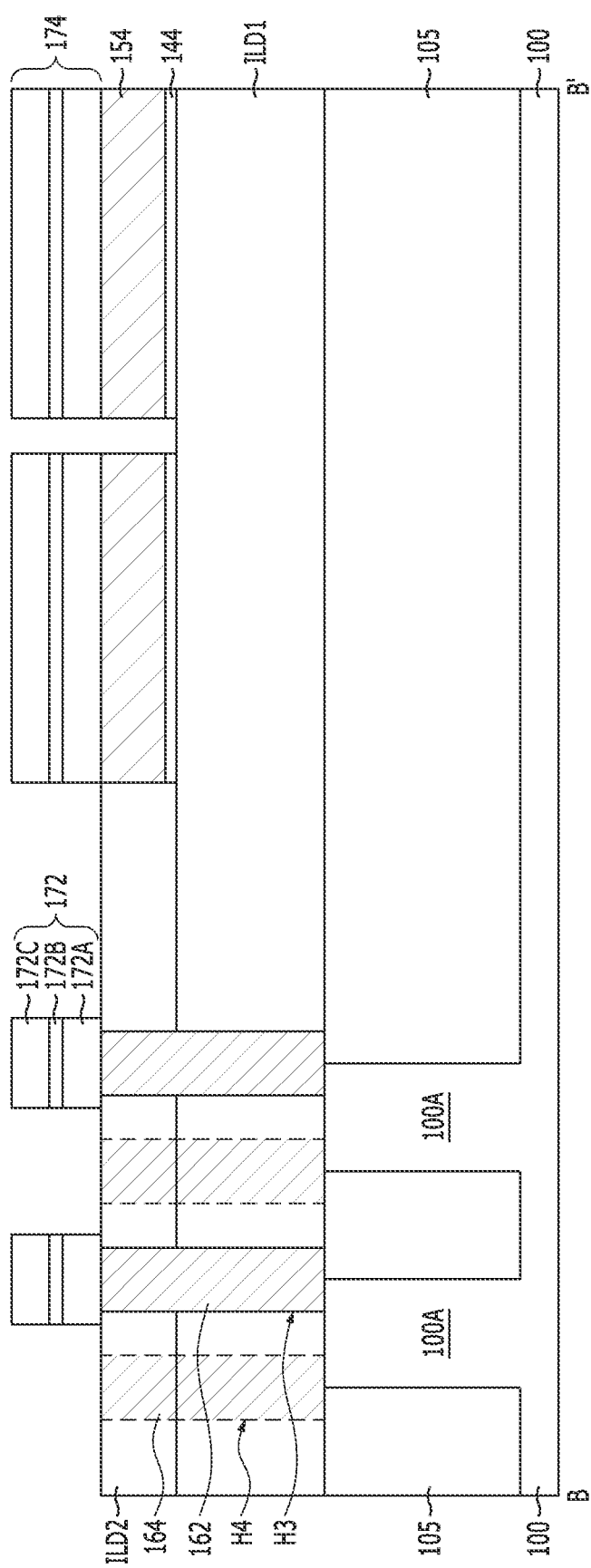

Referring to FIGS. 1 and 7A to 7C, a third interlayer dielectric layer ILD3 is formed to cover the resultant structure of FIGS. 6A to 6C.

The third interlayer dielectric layer ILD3 of the cell array region C may be selectively etched to form a fifth hole H5 and a sixth hole H6 which expose the first variable resistance element 172 and the third contact 164, respectively. The second and third interlayer dielectric layers ILD2 and ILD3 of the cell array region C may be selectively etched to form a seventh hole H7 which exposes the first contact 132. The third interlayer dielectric layer ILD3 of the peripheral circuit region P may be selectively etched to expose an eighth hole H8 which exposes the second variable resistance element 174. When the second variable resistance element 174 is omitted, the eighth hole H8 may expose the top electrode 154. The number and positions of eighth holes H8 may be changed in various manners, as long as the eighth holes H8 overlap the two second variable resistance elements 174, respectively. In the present implementation, two eighth holes H8 are positioned over an end portion of each of the second variable resistance element 174, while overlapping the second variable resistance element 174. However, other implementations are also possible.

Then, a fourth contact 182, a fifth contact 184, a sixth contact 186, and a seventh contact 188 are formed to fill the fifth to eighth holes H5 to H8, respectively. The fourth contact 182, the fifth contact 184, the sixth contact 186, and the seventh contact 188 may be formed through the following process: a conductive material is formed to have a thickness to sufficiently fill the fifth to eighth holes H5 to H8 and a planarization process is performed to expose the third interlayer dielectric layer ILD3. Thus, the fourth contact 182 may be coupled to the top of the first variable resistance element 172, the fifth contact 184 may be coupled to the third contact 164, the sixth contact 186 may be coupled to the first contact 132, and the seventh contact 188 may be coupled to the top of the second variable resistance element 174. The seventh contact 188 may be coupled to the top of the top electrode 154 when the second variable resistance element 174 is omitted.

Then, a conductive material is deposited over the third interlayer dielectric layer ILD3 and then patterned to form a bit line 192, a source line 194, a first wiring (or first pad) 196, and a second wring (or second pad) 198. The bit line 192 is extended in the first direction while coupled to the fourth contacts 182 arranged in the first direction. The source line 194 is extended in the first direction while coupled to the fifth contacts 184 arranged in the first direction. The first wiring (or first pad) 196 is coupled to the sixth contact 186. The second wiring (or second pad) 198 is coupled to the seventh contact 188.

Although in the cross-sectional views of FIGS. 7A to 7C, the fifth contact 184 is not seen, for convenience of description, the fifth contact 184 is indicated by a dotted line in FIG. 7B. Furthermore, although the seventh contact 188 and the second wiring 198 are not seen, for convenience of description, the seventh contact 188 and the second wiring 198 are indicated by dotted lines in FIG. 7A.

Through the above-described processes, the semiconductor device illustrated in FIGS. 1 and 7A to 7C may be fabricated.

Referring to FIGS. 1 and 7A to 7C, the semiconductor device may include the cell array region C in which a plurality of memory cells are arranged and the peripheral circuit region P in which decoupling capacitors are formed.

In the cell array region C of the semiconductor substrate 100, the first buried gates 112 may extend in the second direction to cross the active regions 100A of the semiconductor substrate 100 extending in the first direction. The active region 100A at one side of the first buried gate 112, for example, the drain region may be coupled to the bit line 192 through the second contact 162, the first variable resistance element 172, and the fourth contact 182. The active region 100A at the other side of the first buried gate 112, for example, the source region may be coupled to the source line 194 through the third contact 164 and the fifth contact 184. The first buried gate 112 and the source and drain regions at both sides of the first buried gate 112 may form a transistor. In the present implementation, since the source region is disposed between the pair of first buried gates 112 and the drain regions are disposed at both sides of the pair of first buried gates 112, the semiconductor device in accordance with the present implementation may include two transistors coupled in series which share the source region. The first buried gate 112 may be coupled to the first wiring 196 through the first contact 132 and the sixth contact 186 which are positioned over the end portion of the first buried gate 112.

FIG. 8A is a circuit diagram of the cell array region C. Referring to FIG. 8A, two transistors TR may be coupled in series, a source region shared by the two transistors TR may be commonly coupled to a source line SL, and drain regions of the two transistors TR may be coupled to one ends of the corresponding variable resistance elements R, respectively. The gates of the transistors TR may correspond to the first buried gate 112, the variable resistance element R may correspond to the first variable resistance element 172, and the bit line BL and the source line SL may correspond to the bit line 192 and the source line 194, respectively.

When the transistor TR is turned on according to a voltage applied to the first buried gate 112 through the first wiring 196 in the cell array region C, a required operating voltage may be applied across the first variable resistance element 172 through the bit line 192 and the source line 194. Thus, the resistance state of the first variable resistance element 172 may be changed.

In the peripheral circuit region P, the second buried gate 114 may be disposed within the isolation layer 105. The second buried gate 114 is formed of the same material at the same level as the first buried gate 112. In the present implementation, the second buried gate 114 is formed to have substantially the same plan shape as the first buried gate 112, while having an one-to-one correspondence with the first buried gate 112. However, the present implementation is not limited thereto, but the shape and number of second buried gates 114 may be changed in various manners.

The bottom electrode 134 of the decoupling capacitor may be disposed over the second buried gate 114 so that it is formed at the same level as the first contact 132 of the cell array region C. The bottom electrode 134 and the first contact 132 may be formed of the same material or different materials. In the present implementation, four bottom electrodes 134 are coupled to each of the second buried gates 114, and the plurality of bottom electrodes 134 are arranged to be collectively in a zigzag shape. However, other implementations are also possible. In the present implementation, the position and number of bottom electrodes 134 coupled to each of the second buried gates 114 may be changed in various manners. Although in the present implementation, the bottom electrode 134 has a cylindrical shape, other implementations are also possible. For example, the bottom electrode 134 may have a pillar shape.

The dielectric layer pattern 144 and the top electrode 154 of the decoupling capacitor may be formed over the bottom electrode 134. In the present implementation, the dielectric layer pattern 144 and the top electrode 154 may have a plate shape to cover the peripheral circuit region P, and may be separated into two parts in the second direction. The numbers of bottom electrodes 134 which overlap each of the separated parts of the dielectric layer pattern 144 and the top electrode 154 may be equal to each other. However, other implementations are also possible. For example, the shapes and numbers of dielectric layer patterns 144 and top electrodes 154 may be changed. Further, the number of bottom electrodes 134 to overlap the dielectric layer pattern 144 and the top electrode 154 may also be changed in various manners. The dielectric layer patterns 144 and the top electrodes 154 may be formed before the first variable resistance element 172 of the cell array region C. Thus, the dielectric layer patterns 144 and the top electrode 154 may be positioned at a lower level than the first variable resistance element 172.

The second variable resistance element 174 may be disposed over the dielectric layer pattern 144 and the top electrode 154. The second variable resistance element 174 is formed of the same material at the same level as the first variable resistance 172 of the cell array region C, and has substantially the same plan shape as the top electrode 154. Alternatively, the second variable resistance element 174 may be omitted.

The seventh contact 188 may be disposed over the second variable resistance element 174 (or the top electrode 154 when the second variable resistance element 174 is omitted). The second contact 188 is formed of the same material at the same level as the fourth to sixth contacts 182, 186, and 188 of the cell array region C.

The second wiring 198 may be formed over the seventh contact 188. The second wiring 198 is formed of the same material at the same level as the bit line 192, the source line 194, and the first wiring 196 of the cell array region C.

FIG. 8B is a circuit diagram of the peripheral circuit region P. Referring to FIG. 8B, one ends of first and second decoupling capacitors C1 and C2 may be coupled in series to each other through a buried gate BG. The other ends of the first and second decoupling capacitors C1 and C2 may be separated from each other so as to receive different operating voltages. For example, the other end of the first decoupling capacitor C1 receives a ground voltage VSS and the other end of the second decoupling capacitor C2 receives a power supply voltage VDD. The one ends of the first and second decoupling capacitors C1 and C2 may correspond to the bottom electrode 134, the buried gate BG may correspond to the second buried gate 114, and the other ends of the decoupling capacitors C1 and C2 may correspond to the top electrode 154 or the second variable resistance element 174 or the both. Supply sources of the power supply voltage VDD and the ground voltage VSS may correspond to the second wirings 198.

In the peripheral circuit region P, the power supply voltage VDD may be supplied to the top electrode 154 of the first decoupling capacitor C1 through any one of two second wirings 198, and the ground voltage VSS may be supplied to the top electrode 154 of the second decoupling capacitor C2 through the other of the two second wirings 198. The second buried gate 114 may couple the bottom electrodes 134 of the first and second decoupling capacitors C1 and C2.

The above-described semiconductor device and the method for fabricating the same may have the following advantages.

First, since the bottom electrode 134 of the decoupling capacitor of the peripheral circuit region P is formed when the first contact 132 of the cell array region C is formed, the surface area of the bottom electrode 134 may be increased in a vertical direction. Thus, the capacity of the decoupling capacitor may be secured without increasing the size of the device.

Furthermore, the decoupling capacitor of the peripheral circuit region P is formed before the first variable resistance element 172 of the cell array region C is formed. Thus, although a high-temperature heat treatment to secure the capacity of the decoupling capacitor is performed on the decoupling capacitor, the characteristic of the first variable resistance element 172 can be maintained. The characteristic of the variable resistance element is usually degraded at a high temperature of about 400° C. or more.

Furthermore, when the first variable resistance element 172 of the cell array region C is an MTJ, the second variable resistance element 174 having a large area may be formed over the top electrode 154 of the peripheral circuit region P, while the first variable resistance element 172 is formed. Thus, the resistance of the top electrode 154 may be reduced.

Furthermore, since the first and second decoupling capacitors C1 and C2 coupled in series are formed in the peripheral circuit region P, the voltage applied to each of the first and second decoupling capacitors C1 and C2 may be reduced to the half. Thus, although the dielectric layer patterns 144 of the first and second decoupling capacitors C1 and C2 have a small thickness, the undesired leakage current may be reduced due to this reduction of the applied voltage.

In the above-described implementation, two decoupling capacitors coupled in series are disposed in the peripheral circuit region P. However, other implementations are also possible. For example, a decoupling capacitor having bottom and top electrodes to receive different voltages may be disposed in the peripheral circuit region P. Hereafter, the decoupling capacitor will be described with reference to FIGS. 9 to 11.

Figure 9:
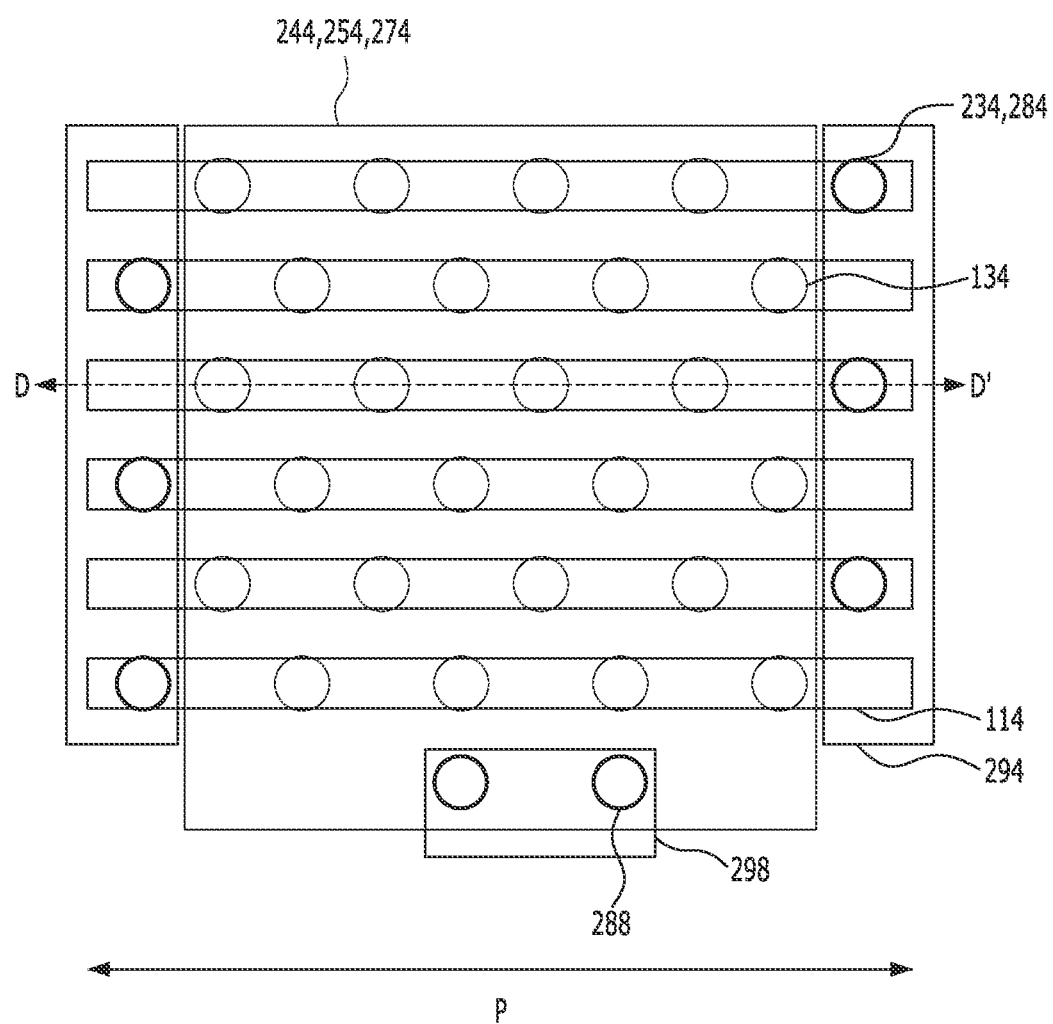
FIG. 9 is a plan view of a peripheral circuit region of a semiconductor device in accordance with another implementation.
Figure 10:
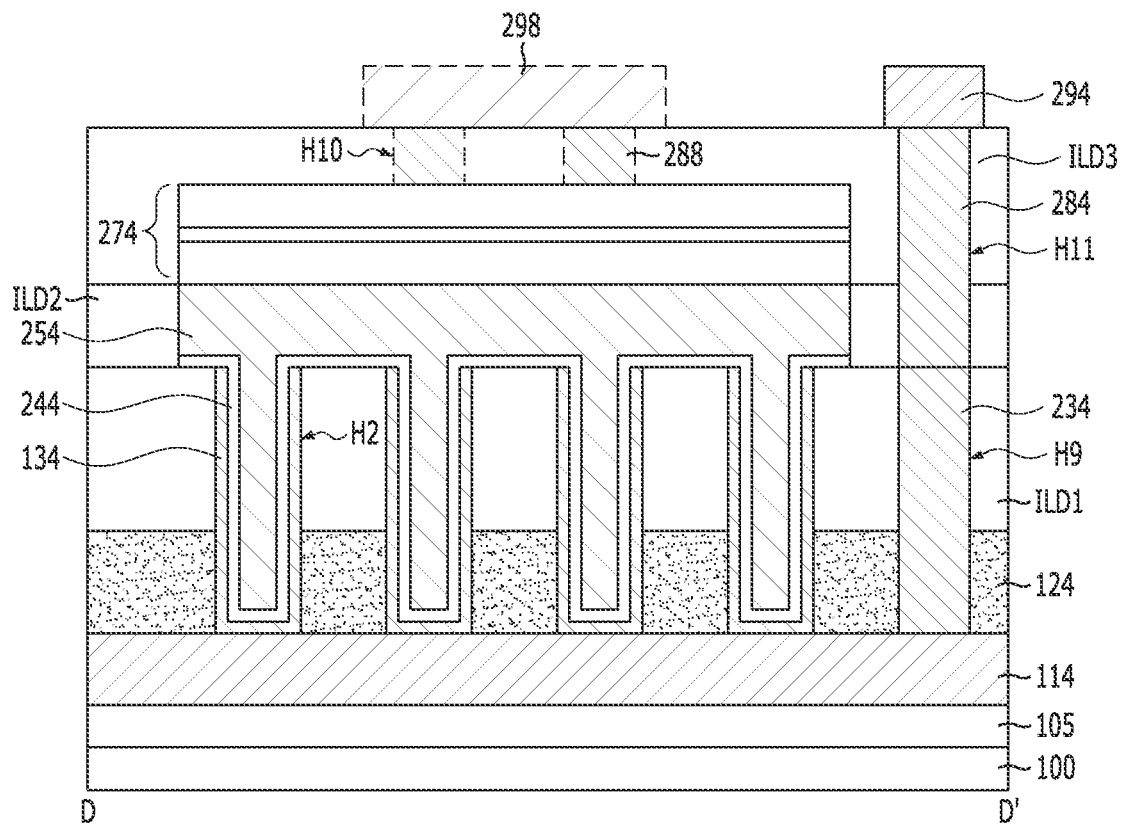
FIG. 10 is a cross-sectional view taken along line D-D' of FIG. 9.
Figure 11:
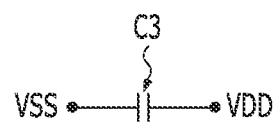
FIG. 11 is an equivalent circuit diagram corresponding to FIG. 9.

FIG. 9 is a plan view of a peripheral circuit region of a semiconductor device in accordance with another implementation. FIG. 10 is a cross-sectional view taken along line D-D' of FIG. 9. FIG. 11 is a circuit equivalent as the semiconductor device in FIG. 9. The following descriptions will be focused on differences from the above-described implementation. The cell array region C and the fabrication method in accordance with the above-described implementation may be substantially the same as a cell array region (not illustrated) of the semiconductor device and a fabrication method in accordance with the present implementation.

First, the fabrication method will be described.

Referring to FIGS. 9 to 11, a second buried gate 114 and a second capping layer 124 of the peripheral circuit region P are formed together with a first buried gate and a first capping layer of the cell array region. Then, a first interlayer dielectric layer ILD1 is formed.

While a first hole is formed to expose the first buried gate of the cell array region, a second hole H2 and a ninth hole H9 may be formed to expose the second buried gate 114 of the peripheral circuit region P. The second hole H2 serves to provide a region in which a bottom electrode of a decoupling capacitor is to be formed, and may overlap the second buried gate 114 except one end or both ends of the second buried gate 114, in the second direction. The ninth hole H9 serves to provide a region in which a contact for coupling the second buried gate 114 to an external wiring is to be formed, and may be formed to expose one end or both ends of the second buried gate 114. In the present implementation, the ninth holes H9 may expose both ends of the second buried gates 114. In this case, in order to guarantee a distance between the ninth holes H9, the ninth hole H9 may alternately expose one ends and the other ends of the second buried gates 114. In other words, for odd numbered second buried gates 114, the ninth holes H9 may be arranged to expose one ends, for example, the right ends and for even numbered second buried gates 114, the ninth holes H9 may be arranged to expose the other ends, for example, the left ends.

While a first contact of the cell array region is formed, an eighth contact 234 may be formed within the ninth hole H9. The eighth contact 234 may be formed through the following process: a conductive material is deposited to a thickness to sufficiently fill the first hole of the cell array region and the ninth hole H9 of the peripheral circuit region P in a state where a mask (not illustrated) is formed to cover the second hole H2, and a planarization process is performed. The eighth contact 234 may be coupled to the end of each of the second buried gates 114. In the present implementation, the eighth contact 234 may be alternately coupled to each of one ends and the other ends of the second buried gates 114. The formation of the bottom electrode 134 within the second hole H2 may be performed in the same manner as the above-described implementation.

Then, a dielectric layer pattern 244 and a top electrode 254 are formed to overlap the entire bottom electrode 134 in the peripheral circuit region P. In the present implementation, the dielectric layer pattern 244 and the top electrode 254 may have a plate shape to cover the peripheral circuit region P except the region in which the eighth contact 234 is disposed. As the dielectric layer pattern 244 and the top electrode 254 are formed, a third decoupling capacitor C3 including the bottom electrode 134, the dielectric layer pattern 244, and the top electrode 254 may be formed in the peripheral circuit region P.

After a second dielectric layer ILD2 is formed and second and third contacts of the cell array region are formed, a second variable resistance element 274 may be formed in the peripheral circuit region P so as to be coupled to the top electrode 254, while a first variable resistance element is formed in the cell array region. The second variable resistance element 274 may have substantially the same plan shape as the top electrode 254.

Then, a third interlayer dielectric layer ILD3 is formed. While fifth to seventh holes are formed in the cell array region, the third interlayer dielectric layer ILD3 of the peripheral circuit region P is selectively etched to form a tenth hole H10 which exposes the second variable resistance element 274, and the second and third interlayer dielectric layers ILD2 and ILD3 of the peripheral circuit region P are selectively etched to form an eleventh hole H11 which exposes the eighth contact 234.

Fourth to sixth contacts, a ninth contact 288, and a tenth contact 284 may be formed to fill the fifth to seventh holes, the tenth hole H10, and the eleventh hole H11, respectively. The fourth to sixth contacts, the ninth contact 288, and the tenth contact 284 may be formed through the following process: a conductive material is formed to a thickness to sufficiently fill the fifth to seventh holes, the tenth hole H10, and the eleventh hole H11, and a planarization process is performed to expose the third interlayer dielectric layer ILD3.

Furthermore, a conductive material may be deposited over the third interlayer dielectric layer ILD3 and then patterned to form a second wiring (or second pad) 298 coupled to the ninth contact 288 and a third wiring (or third pad) 294 coupled to the tenth contact 284, while a bit line, a source line, and a first wiring of the cell array region are formed. Although in the cross-sectional view of FIG. 10, the ninth contact 288 and the second wiring 298 are not seen, for convenience of description, the ninth contact 288 and the second wiring 298 are indicated by dotted lines.

Through the above-described process, the semiconductor device illustrated in FIGS. 9 to 11 may be fabricated.

The present implementation has the following differences from the above-described implementation. First, the bottom electrode 134 and the eighth contact 234 of the decoupling capacitor may be disposed over the second buried gate 114. Furthermore, the bottom electrodes 134 may be arranged in a zigzag shape over the second buried gates 114 except the ends of the second buried gates 114, and the eighth contacts 234 may be alternately arranged at the ends of the second buried gates 114, or particularly, one ends and the other ends of the second buried gates 114.

The dielectric layer pattern 244 and the top electrode 254 of the decoupling capacitor may be formed over the bottom electrode 134. In the present implementation, the dielectric layer pattern 244 and the top electrode 254 may have a plate shape to cover the peripheral circuit region P except the eighth contact 234, and thus overlap the entire bottom electrode 134. The second variable resistance element 274 having the same plane shape as the top electrode 254 may be disposed over the top electrode 254, and coupled to the second wiring 298 through the ninth contact 288.

The tenth contact 284 and the third wiring 294 may be disposed over the eighth contact 234. Thus, the second buried gate 114 may be coupled to the third wiring 294 through the eighth contact 234 and the tenth contact 284.

One end and the other end of the third decoupling capacitor C3 including the bottom electrode 134, the dielectric layer pattern 244, and the top electrode 254 may receive different operating voltages including a power supply voltage VDD and a ground voltage VSS. The one end of the third decoupling capacitor C3 may correspond to the second buried gate 114, and the other end of the third decoupling capacitor C3 may correspond to the top electrode 254 or the second variable resistance element 274 or the both. Supply sources of the power supply voltage VDD and the ground voltage VSS may correspond to the second wiring 298 and the third wiring 294.

In the peripheral circuit region P, the power supply voltage VDD may be supplied to the top electrode 254 of the third decoupling capacitor C3 through the second wiring 298, and the ground voltage VSS may be supplied to the bottom electrode 134 of the third decoupling capacitor C3 through the third wiring 294.

In the present implementation, the dielectric layer pattern 244 of the third decoupling capacitor C3 has a relatively large thickness. Thus, the present implementation may be applied to a case in which leakage current is relatively small.

In accordance with the implementations, it is possible to implement a high-capacity decoupling capacitor without increasing the size in a device including a variable resistance element. Furthermore, it is possible to improve the characteristics of the variable resistance element and the decoupling capacitor.

The above and other memory circuits or semiconductor devices based on the disclosed technology can be used in a range of devices or systems. FIGS. 12-16 provide some examples of devices or systems that can implement the memory circuits disclosed herein.

Figure 12:
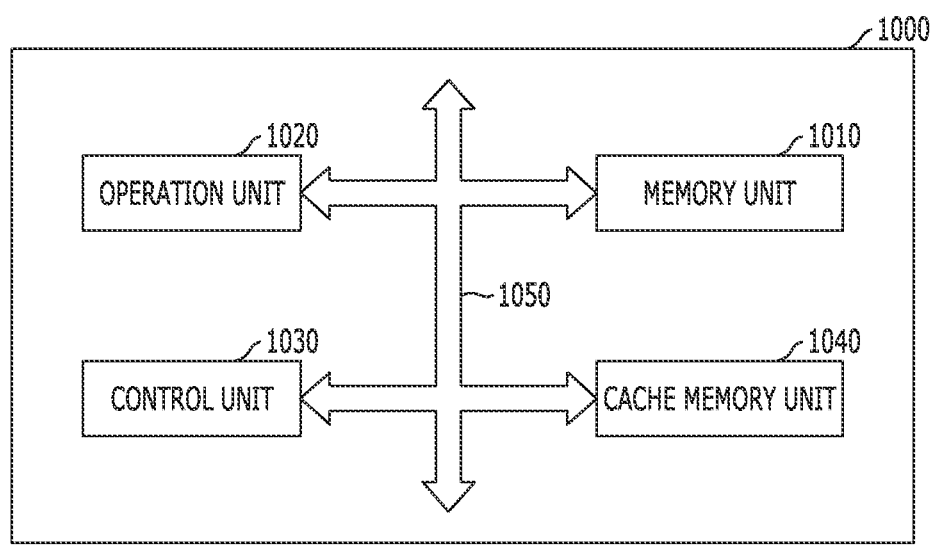
FIG. 12 is an example of configuration diagram of a microprocessor implementing memory circuitry based on the disclosed technology.

FIG. 12 is an example of configuration diagram of a microprocessor implementing memory circuitry based on the disclosed technology.

Referring to FIG. 12, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a cell array region having a first variable resistance element and a peripheral circuit region having a decoupling capacitor, the decoupling capacitor including a bottom electrode, a dielectric layer pattern, and a top electrode, wherein the cell array region comprises: a first gate; a first contact over the first gate; a second contact over an active region at one side of the first gate; and the first variable resistance element over the second contact, and the peripheral circuit region comprises: a second gate formed of the same material at the same level as the first gate; the bottom electrode disposed over the second gate and formed at the same level as the first contact; and the dielectric layer pattern and the top electrode disposed over the bottom electrode and positioned at a lower level than the first variable resistance element. Through this, data storage characteristics and operating characteristics of the memory unit 1010 may be improved, and a size of the memory unit 1010 may be reduced. As a consequence, operating characteristics of the microprocessor 1000 may be improved and a size of the microprocessor 1000 may be reduced.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 13:
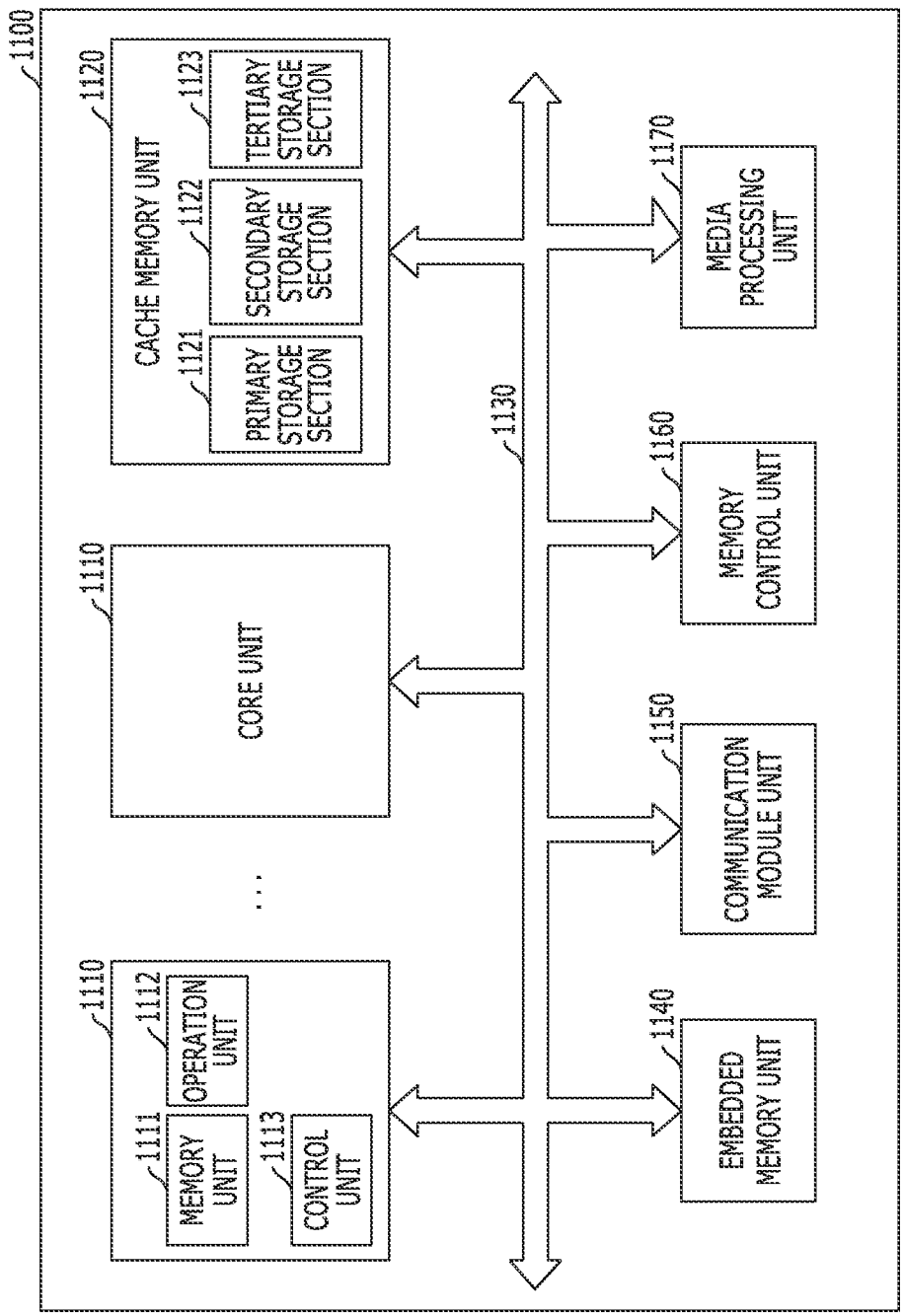
FIG. 13 is an example of configuration diagram of a processor implementing memory circuitry based on the disclosed technology.

FIG. 13 is an example of configuration diagram of a processor implementing memory circuitry based on the disclosed technology.

Referring to FIG. 13, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a cell array region having a first variable resistance element and a peripheral circuit region having a decoupling capacitor, the decoupling capacitor including a bottom electrode, a dielectric layer pattern, and a top electrode, wherein the cell array region comprises: a first gate; a first contact over the first gate; a second contact over an active region at one side of the first gate; and the first variable resistance element over the second contact, and the peripheral circuit region comprises: a second gate formed of the same material at the same level as the first gate; the bottom electrode disposed over the second gate and formed at the same level as the first contact; and the dielectric layer pattern and the top electrode disposed over the bottom electrode and positioned at a lower level than the first variable resistance element. Through this, data storage characteristics and operating characteristics of the cache memory unit 1120 may be improved, and a size of the cache memory unit 1120 may be reduced. As a consequence, operating characteristics of the processor 1100 may be improved, and a size of the processor 1100 may be reduced.

Although it was shown in FIG. 13 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 14:
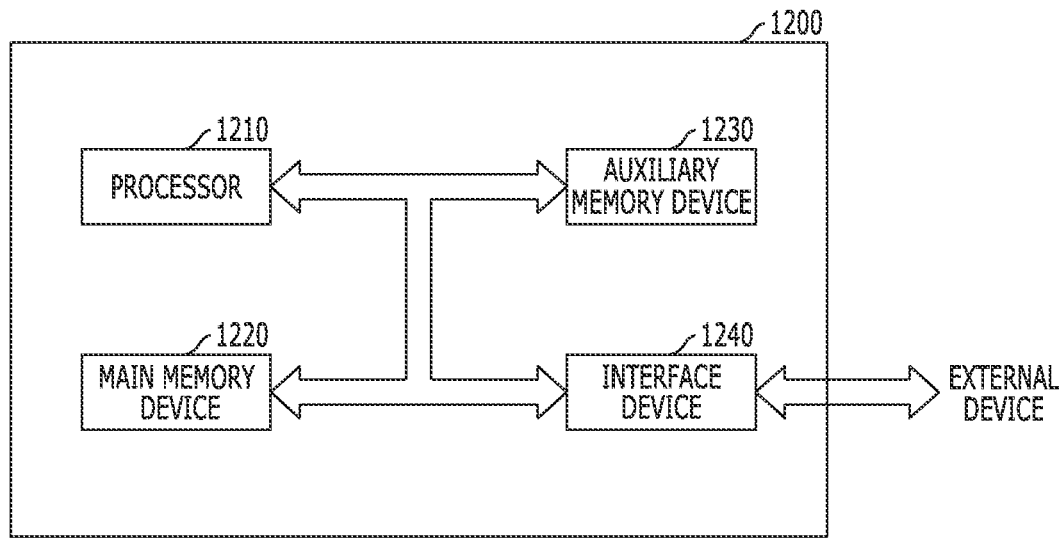
FIG. 14 is an example of configuration diagram of a system implementing memory circuitry based on the disclosed technology.

FIG. 14 is an example of configuration diagram of a system implementing memory circuitry based on the disclosed technology.

Referring to FIG. 14, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a cell array region having a first variable resistance element and a peripheral circuit region having a decoupling capacitor, the decoupling capacitor including a bottom electrode, a dielectric layer pattern, and a top electrode, wherein the cell array region comprises: a first gate; a first contact over the first gate; a second contact over an active region at one side of the first gate; and the first variable resistance element over the second contact, and the peripheral circuit region comprises: a second gate formed of the same material at the same level as the first gate; the bottom electrode disposed over the second gate and formed at the same level as the first contact; and the dielectric layer pattern and the top electrode disposed over the bottom electrode and positioned at a lower level than the first variable resistance element. Through this, data storage characteristics and operating characteristics of the main memory device 1220 may be improved, and a size of the main memory device 1220 may be reduced. As a consequence, operating characteristics of the system 1200 may be improved, and a size of the system 1000 may be reduced.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a cell array region having a first variable resistance element and a peripheral circuit region having a decoupling capacitor, the decoupling capacitor including a bottom electrode, a dielectric layer pattern, and a top electrode, wherein the cell array region comprises: a first gate; a first contact over the first gate; a second contact over an active region at one side of the first gate; and the first variable resistance element over the second contact, and the peripheral circuit region comprises: a second gate formed of the same material at the same level as the first gate; the bottom electrode disposed over the second gate and formed at the same level as the first contact; and the dielectric layer pattern and the top electrode disposed over the bottom electrode and positioned at a lower level than the first variable resistance element. Through this, data storage characteristics and operating characteristics of the auxiliary memory device 1230 may be improved, and a size of the auxiliary memory device 1230 may be reduced. As a consequence, operating characteristics of the system 1200 may be improved, and a size of the system 1000 may be reduced.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 15:
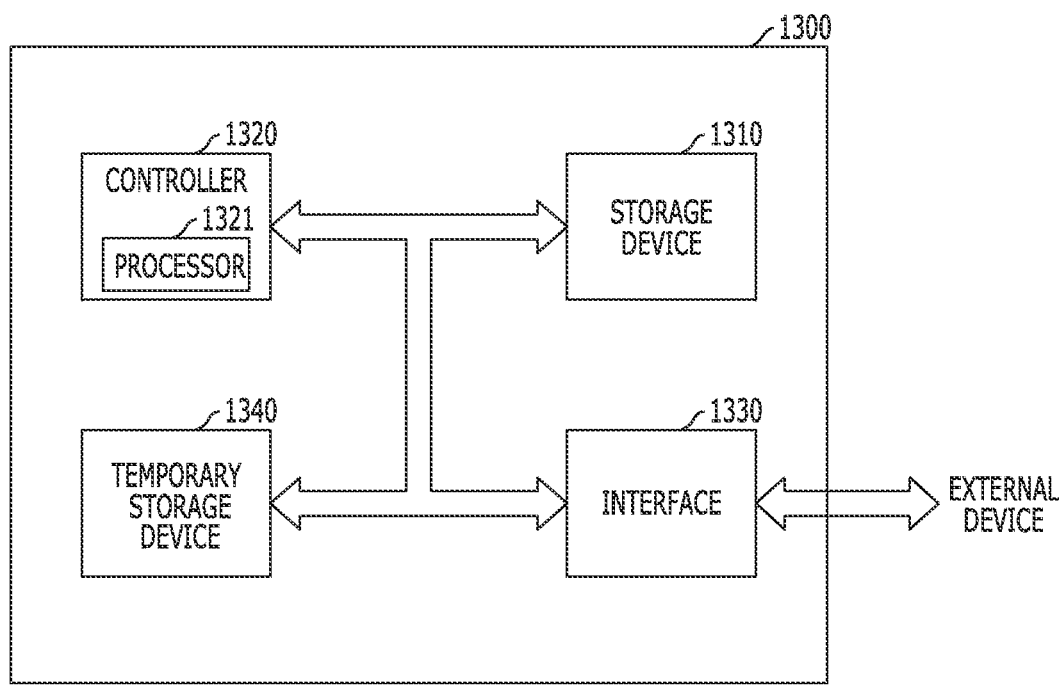
FIG. 15 is an example of configuration diagram of a data storage system implementing memory circuitry based on the disclosed technology.

FIG. 15 is an example of configuration diagram of a data storage system implementing memory circuitry based on the disclosed technology.

Referring to FIG. 15, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a cell array region having a first variable resistance element and a peripheral circuit region having a decoupling capacitor, the decoupling capacitor including a bottom electrode, a dielectric layer pattern, and a top electrode, wherein the cell array region comprises: a first gate; a first contact over the first gate; a second contact over an active region at one side of the first gate; and the first variable resistance element over the second contact, and the peripheral circuit region comprises: a second gate formed of the same material at the same level as the first gate; the bottom electrode disposed over the second gate and formed at the same level as the first contact; and the dielectric layer pattern and the top electrode disposed over the bottom electrode and positioned at a lower level than the first variable resistance element. Through this, data storage characteristics and operating characteristics of the temporary storage device 1340 may be improved, and a size of the temporary storage device 1340 may be reduced. As a consequence, operating characteristics of the data storage system 1300 may be improved, and a size of the data storage system 1300 may be reduced.

Figure 16:
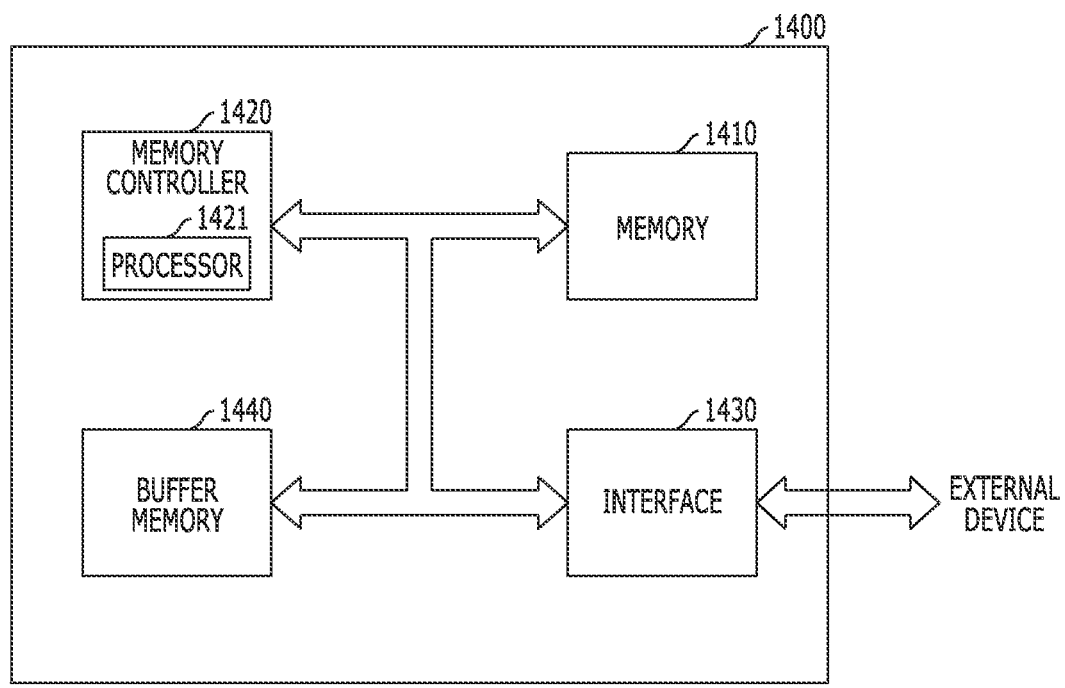
FIG. 16 is an example of configuration diagram of a memory system implementing memory circuitry based on the disclosed technology.

FIG. 16 is an example of configuration diagram of a memory system implementing memory circuitry based on the disclosed technology.

Referring to FIG. 16, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a cell array region having a first variable resistance element and a peripheral circuit region having a decoupling capacitor, the decoupling capacitor including a bottom electrode, a dielectric layer pattern, and a top electrode, wherein the cell array region comprises: a first gate; a first contact over the first gate; a second contact over an active region at one side of the first gate; and the first variable resistance element over the second contact, and the peripheral circuit region comprises: a second gate formed of the same material at the same level as the first gate; the bottom electrode disposed over the second gate and formed at the same level as the first contact; and the dielectric layer pattern and the top electrode disposed over the bottom electrode and positioned at a lower level than the first variable resistance element. Through this, data storage characteristics and operating characteristics of the memory 1410 may be improved, and a size of the memory 1410 may be reduced. As a consequence, operating characteristics of the memory system 1400 may be improved and a size of the memory system 1400 may be reduced.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a cell array region having a first variable resistance element and a peripheral circuit region having a decoupling capacitor, the decoupling capacitor including a bottom electrode, a dielectric layer pattern, and a top electrode, wherein the cell array region comprises: a first gate; a first contact over the first gate; a second contact over an active region at one side of the first gate; and the first variable resistance element over the second contact, and the peripheral circuit region comprises: a second gate formed of the same material at the same level as the first gate; the bottom electrode disposed over the second gate and formed at the same level as the first contact; and the dielectric layer pattern and the top electrode disposed over the bottom electrode and positioned at a lower level than the first variable resistance element. Through this, data storage characteristics and operating characteristics of the buffer memory 1440 may be improved, and a size of the buffer memory 1440 may be reduced. As a consequence, operating characteristics of the memory system 1400 may be improved and a size of the memory system 1400 may be reduced.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 12-16 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory which comprises:
    a cell array region having a first variable resistance element and a peripheral circuit region having a decoupling capacitor including a bottom electrode, a dielectric layer pattern, and a top electrode,
    wherein the cell array region includes a first gate, a first contact over the first gate, a second contact over an active region at one side of the first gate, and the first variable resistance element over the second contact, and
    the peripheral circuit region includes a second gate formed of the same material at the same level as the first gate, the bottom electrode disposed over the second gate and formed at the same level as the first contact, and the dielectric layer pattern and the top electrode disposed over the bottom electrode and positioned at a lower level than the first variable resistance element.

2. The electronic device of claim 1, wherein the first variable resistance element includes a first ferromagnetic layer, a second ferromagnetic layer, and a tunnel barrier layer interposed therebetween, and
    the peripheral circuit region further includes a second variable resistance element disposed over the top electrode and formed of the same material at the same level as the first variable resistance element.

3. The electronic device of claim 2, wherein the bottom electrode includes a plurality of bottom electrodes,
    the top electrode has a plate shape to overlap one or more of the plurality of bottom electrodes, and
    the second variable resistance element has a shape that is the same as or similar to a shape of the top electrode.

4. The electronic device of claim 1, wherein the bottom electrode includes a plurality of bottom electrodes coupled to the second gate, and
    the top electrode includes a first top electrode and a second top electrode that are separate from each other and overlap part of the plurality of bottom electrodes and the rest of the plurality of bottom electrodes, respectively.

5. The electronic device of claim 4, wherein the first top electrode and the second top electrode are provided with different levels of operating voltages.

6. The electronic device of claim 1, wherein the bottom electrode includes a plurality of bottom electrodes coupled to the second gate, and,
    the top electrode overlaps all of the plurality of bottom electrodes.

7. The electronic device of claim 6, wherein the top electrode and the second gate are provided with different levels of operating voltages.

8. The electronic device of claim 1, wherein the bottom electrode has a cylinder shape.

9. The electronic device of claim 1, wherein the first and second gates are buried in the semiconductor substrate.

10. The electronic device of claim 1, wherein the first variable resistance element includes a metal oxide, a phase change material, a ferroelectric material, or a ferromagnetic material.

11. The electronic device of claim 1, wherein the cell array region further comprises a first wiring coupled to the first contact and a bit line coupled to the first variable resistance element,
    the peripheral circuit region further comprises a second wiring coupled to the top electrode, and
    the first wiring, the bit line, and the second wiring are formed of the same material at the same level.

12. The electronic device of claim 11, wherein the peripheral circuit region further comprises a third wiring coupled to the second gate through a contact, and the first wiring, the bit line, the second wiring, and the third wiring are formed of the same material at the same level.

13. An electronic device comprising a semiconductor memory, wherein the semiconductor memory comprises:

a cell array region comprising a first variable resistance element having a first ferromagnetic layer, a second ferromagnetic layer, and a tunnel barrier layer interposed therebetween; and a peripheral circuit region comprising a decoupling capacitor having a bottom electrode, a dielectric layer pattern, and a top electrode and a second variable resistance element disposed over the top electrode and formed of the same material at the same level as the first variable resistance element.

14. The electronic device of claim 13, wherein the bottom electrode includes a plurality of bottom electrodes, and the top electrode has a plate shape to overlap one or more of the plurality of bottom electrodes, and the second variable resistance element has a shape that is the same as or similar to a shape of the top electrode.

15. The electronic device of claim 14, wherein the top electrode includes a first top electrode and a second top electrode that are separate from each other and overlap part of the plurality of bottom electrodes and the rest of the plurality of bottom electrodes, respectively, and the first top electrode and the second top electrode are provided with different levels of operating voltages.

16. The electronic device of claim 14, wherein the top electrode overlaps all of the plurality of bottom electrodes, and the top electrode and the bottom electrode are provided with different levels of operating voltages.

17. The electronic device of claim 1, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

18. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

19. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

20. The electronic device of claim 1, wherein the decoupling capacitor filters noise in a voltage applied to operate the first variable resistance element and is electrically coupled to the first variable resistance element in the semiconductor memory.

\* \* \* \* \*